(12) United States Patent
Sehgal et al.

(10) Patent No.: US 10,515,008 B2
(45) Date of Patent: Dec. 24, 2019

(54) PERFORMANCE BASED MEMORY BLOCK USAGE

(71) Applicant: Western Digital Technologies, Inc., San Jose, CA (US)

(72) Inventors: Rohit Sehgal, San Jose, CA (US); Nian Niles Yang, Mountain View, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 183 days.

(21) Appl. No.: 15/793,387

(22) Filed: Oct. 25, 2017

(65) Prior Publication Data

US 2019/0121725 A1 Apr. 25, 2019

(51) Int. Cl.
| | |
|---|---|
| G06F 12/00 | (2006.01) |
| G06F 12/02 | (2006.01) |
| G06F 3/06 | (2006.01) |
| G11C 16/34 | (2006.01) |
| G11C 11/56 | (2006.01) |
| G11C 16/10 | (2006.01) |

(52) U.S. Cl.
CPC ......... *G06F 12/0246* (2013.01); *G06F 3/061* (2013.01); *G06F 3/064* (2013.01); *G06F 3/0619* (2013.01); *G06F 3/0688* (2013.01); *G06F 12/0253* (2013.01); *G11C 11/5628* (2013.01); *G11C 16/10* (2013.01); *G11C 16/349* (2013.01); *G06F 2212/1016* (2013.01)

(58) Field of Classification Search
None
See application file for complete search history.

(56) References Cited

U.S. PATENT DOCUMENTS

| | | |
|---|---|---|
| 2008/0104309 A1 | 5/2008 | Cheon et al. |
| 2009/0319720 A1 | 12/2009 | Stefanus et al. |
| 2011/0153912 A1 | 6/2011 | Gorobets et al. |

(Continued)

OTHER PUBLICATIONS

Ji, Xiaobo, et al., "Intelligent Garbage Collection Policy Based on I/O Workload Prediction for NAND Flash-based Storage Devices," International Journal of Multimedia and Ubiquitous Engineering, vol. 12, No. 1, Feb. 2017, 12 pages.

(Continued)

*Primary Examiner* — Daniel D Tsui
(74) *Attorney, Agent, or Firm* — Vierra Magen Marcus LLP

(57) ABSTRACT

Blocks of memory cells may be selected for use based on one or more measured performance characteristics that may include, but are not limited to, programming time or fail bit count. Blocks may be placed into a single level cell (SLC) block pool and one or more multi-level cell (MLC) block pools based on measured performance characteristic(s). For example, blocks that have a better SLC performance may be placed into the SLC block pool. Blocks may be targeted for garbage collection based on one or more measured performance characteristics. For example, blocks within an SLC block pool may be targeted for garbage collection based on a performance ranking of the SLC blocks, blocks within an MLC block pool may be targeted for garbage collection based on a performance ranking of the MLC blocks. Thus, the better performing blocks may be used more frequently, thereby improving performance.

18 Claims, 17 Drawing Sheets

(56) References Cited

U.S. PATENT DOCUMENTS

| | | |
|---|---|---|
| 2011/0208896 A1 | 8/2011 | Wakrat et al. |
| 2012/0297122 A1 | 11/2012 | Gorobets et al. |
| 2012/0311244 A1 | 12/2012 | Huang et al. |
| 2016/0179597 A1 | 6/2016 | Gorobets et al. |
| 2017/0255399 A1 | 9/2017 | Yang et al. |
| 2018/0165021 A1 | 6/2018 | Tomic et al. |
| 2018/0165022 A1* | 6/2018 | Tomic .................... G06F 11/34 |
| 2018/0293003 A1* | 10/2018 | Muchherla .......... G11C 11/5628 |

OTHER PUBLICATIONS

Micron, "Garbage Collection in Single-Level Cell NAND Flash Memory," TN-2960: Garbage Collection in SLC NAND Flash Memory Introduction, Jun. 2006, 4 pages.

* cited by examiner

First programming pass

Second programming pass

PERFORMANCE BASED MEMORY BLOCK USAGE

BACKGROUND

Semiconductor memory is widely used in various electronic devices such as cellular telephones, digital cameras, personal digital assistants, medical electronics, mobile computing devices, servers, solid state drives, non-mobile computing devices and other devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory).

Memory systems can be used to store data provided by a host device, client, user or other entity. The data can then be read back and provided in response to read requests. It is important that data stored in a memory system is not lost. Performance of the memory system, such as speed of operation, is also important to hosts, clients, users, etc.

BRIEF DESCRIPTION OF THE DRAWINGS

Like-numbered elements refer to common components in the different figures.

DETAILED DESCRIPTION

Non-volatile storage systems and methods of operating non-volatile storage systems are disclosed. In some embodiments disclosed herein, blocks of memory cells are selected for use based on one or more measured performance characteristics. The measured performance characteristics may include, but are not limited to, programming time and fail bit count (FBC). In one embodiment, blocks are placed into a single level cell (SLC) block pool and one or more multi-level cell (MLC) block pools based on one or more measured performance characteristics. For example, blocks that have a better measured performance for a single bit per memory cell performance characteristic may be placed into the SLC block pool.

In one embodiment, blocks are targeted for garbage collection based on one or more measured performance characteristics. For example, blocks within an SLC block pool may be targeted for garbage collection based on a performance ranking of the SLC blocks, blocks within an MLC block pool may be targeted for garbage collection based on a performance ranking of the MLC blocks. Thus, the better performing blocks may be used more frequently, thereby improving performance.

Figure 1:
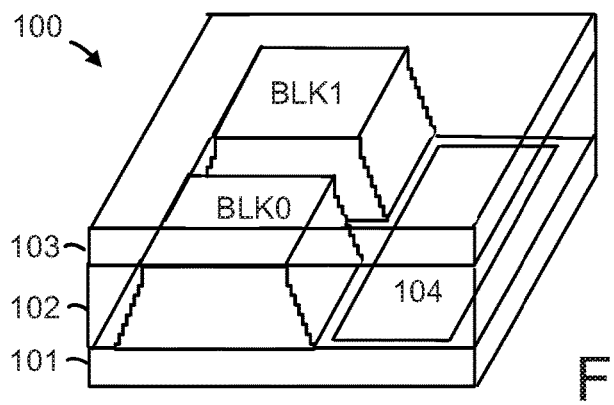
FIG. 1 is a perspective view of a 3D stacked non-volatile memory device.

FIGS. 1-4 describe one example of a memory system that can be used to implement the technology proposed herein. FIG. 1 is a perspective view of a three dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
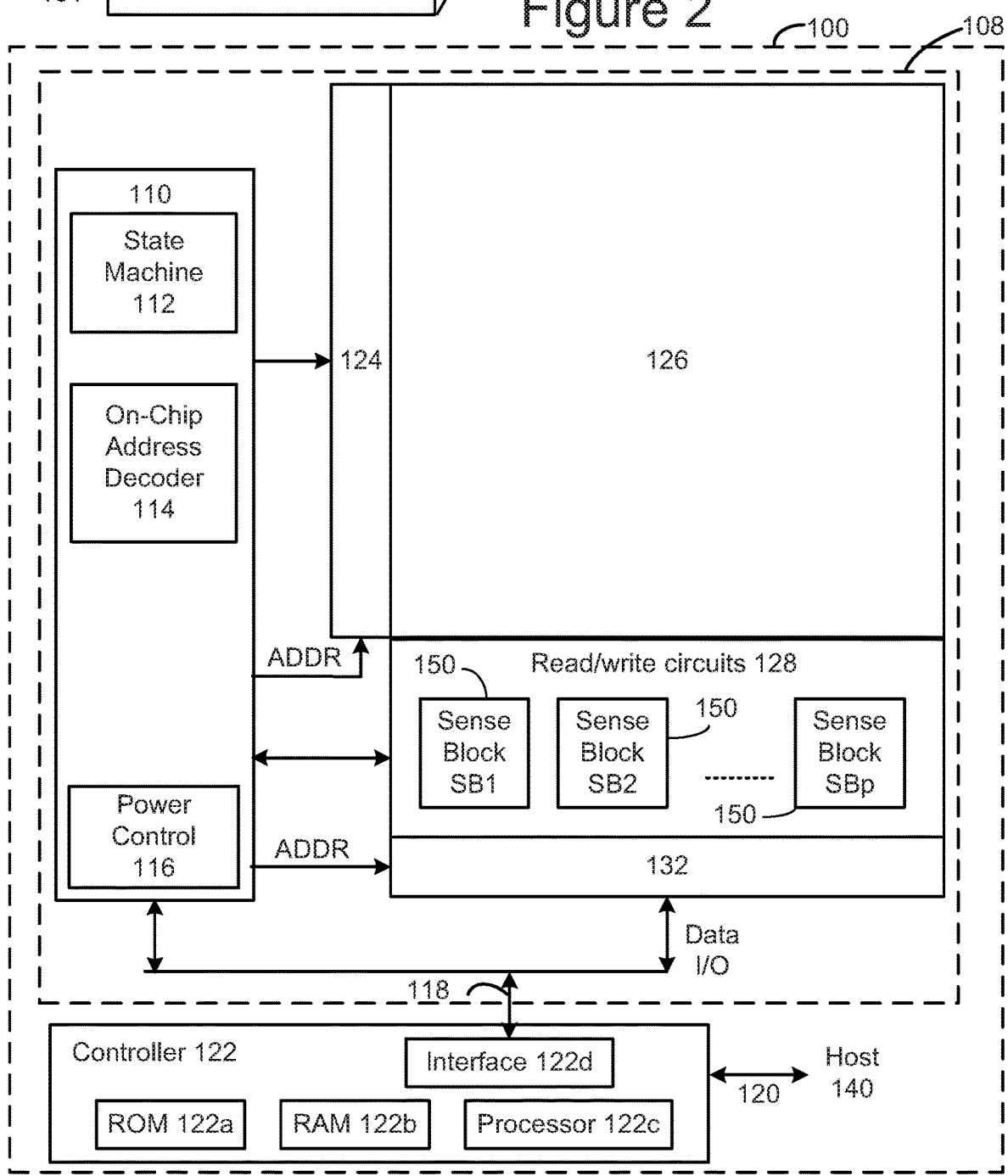
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three dimensional memory structure 126 of memory cells (such as, for example, a 3D array of memory cells), control circuitry 110, and read/write circuits 128. In other embodiments, a two dimensional array of memory cells can be used. Memory structure 126 is addressable by word lines via a row decoder 124 and by bit lines via a column decoder 132. The read/write circuits 128 include multiple sense blocks 150 including SB1, SB2, . . . , SBp (sensing circuitry) and allow a page of memory cells to be read or programmed in parallel. In some systems, a controller 122 is included in the same memory device 100 (e.g., a removable storage card) as the one or more memory die 108. However, in other systems, the controller can be separated from the memory die 108. In some embodiments controller 122 will be on a different die than memory die 108. In some embodiments, one controller 122 will communicate with multiple memory die 108. In other embodiments, each memory die 108 has its own controller. Commands and data are transferred between the host 140 and controller 122 via a data bus 120, and between controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate. In one embodiment, memory structure 126 implements three dimensional NAND flash memory. Other embodiments include two dimensional NAND flash memory, two dimensional NOR flash memory, ReRAM cross-point memories, magnetoresistive memory (e.g., MRAM), phase change memory (e.g., PCRAM), and others.

Control circuitry 110 cooperates with the read/write circuits 128 to perform memory operations (e.g., erase, program, read, and others) on memory structure 126, and includes a state machine 112, an on-chip address decoder 114, a power control module 116. The state machine 112 provides die-level control of memory operations. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, power control module 116, sense blocks 150, read/write circuits 128, and controller 122 can be considered a control circuit that performs the functions described herein.

The (on-chip or off-chip) controller 122 (which in one embodiment is an electrical circuit) may comprise one or more processors 122c, ROM 122a, RAM 122b, Memory Interface 122d, all of which are interconnected. One or more processors 122c is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively or additionally, processor 122c can access code from a storage device in the memory structure, such as a reserved area of memory cells connected to one or more word lines. Memory interface 122d, in communication with ROM 122a, RAM 122b and processor 122c, is an electrical circuit (electrical interface) that provides an electrical interface between controller 122 and one or more memory die 108. For example, memory interface 122d can change the format or timing of signals, provide a buffer, isolate from surges, latch I/O, etc. Processor 122c can issue commands to control circuitry 110 (or any other component of memory die 108) via Memory Interface 122d.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in they direction) with each column having multiple memory cells. The vertical columns may be arranged in a two dimensional configuration, e.g., in an x-y plane, resulting in a three dimensional arrangement of memory cells, with memory cells on multiple vertically stacked memory planes. Other configurations of memory elements in three dimensions can also constitute a three dimensional memory array.

By way of non-limiting example, in a three dimensional NAND memory array, the memory elements may be coupled together to form vertical NAND strings that traverse across multiple horizontal levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
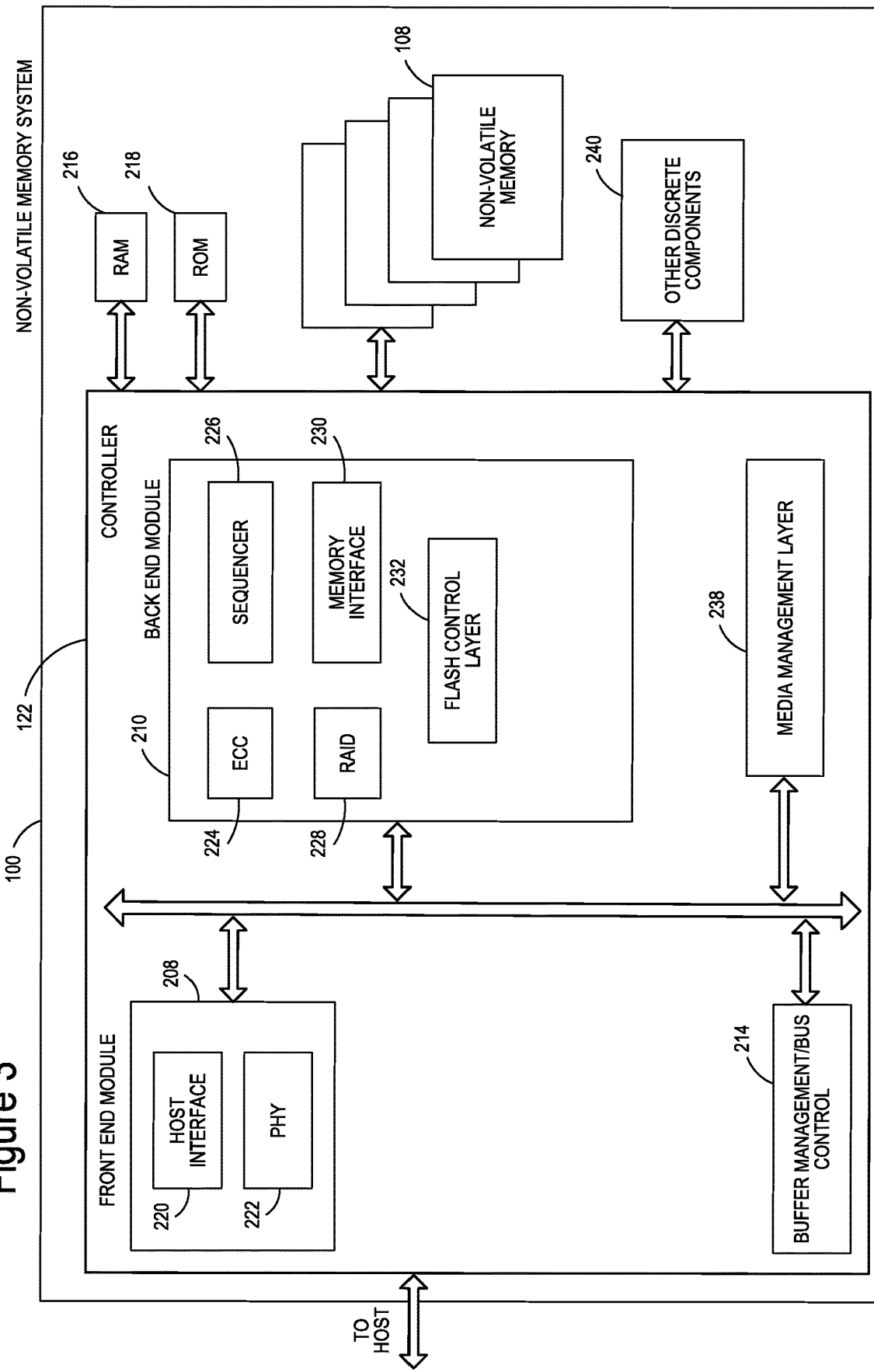
FIG. 3 is a block diagram depicting one embodiment of a memory system.

FIG. 3 is a block diagram of example memory system 100, depicting more details of one embodiment of controller 122. As used herein, a flash memory controller is a device that manages data stored on flash memory and communicates with a host, such as a computer or electronic device. A flash memory controller can have various functionality in addition to the specific functionality described herein. For example, the flash memory controller can format the flash memory to ensure the memory is operating properly, map out bad flash memory cells, and allocate spare memory cells to be substituted for future failed cells. Some part of the spare cells can be used to hold firmware to operate the flash memory controller and implement other features. In operation, when a host needs to read data from or write data to the flash memory, it will communicate with the flash memory controller. If the host provides a logical address to which data is to be read/written, the flash memory controller can convert the logical address received from the host to a physical address in the flash memory. (Alternatively, the host can provide the physical address). The flash memory controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The interface between controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host. In other example, memory system 100 can be in the form of a solid state drive (SSD) drive.

In some embodiments, non-volatile memory system 100 includes a single channel between controller 122 and non-volatile memory die 108, the subject matter described herein is not limited to having a single memory channel. For example, in some memory system architectures, 2, 4, 8 or more channels may exist between the controller and the memory die, depending on controller capabilities. In any of the embodiments described herein, more than a single channel may exist between the controller and the memory die, even if a single channel is shown in the drawings.

As depicted in FIG. 3, controller 122 includes a front end module 208 that interfaces with a host, a back end module 210 that interfaces with the one or more non-volatile memory die 108, and various other modules that perform functions which will now be described in detail.

The components of controller 122 depicted in FIG. 3 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The architecture depicted in FIG. 3 is one example implementation that may (or may not) use the components of controller 122 depicted in FIG. 2 (i.e. RAM, ROM, processor, interface).

Referring again to modules of the controller 122, a buffer manager/bus control 214 manages buffers in random access memory (RAM) 216 and controls the internal bus arbitration of controller 122. A read only memory (ROM) 218 stores system boot code. Although illustrated in FIG. 3 as located separately from the controller 122, in other embodiments one or both of the RAM 216 and ROM 218 may be located within the controller. In yet other embodiments, portions of RAM and ROM may be located both within the controller 122 and outside the controller. Further, in some implementations, the controller 122, RAM 216, and ROM 218 may be located on separate semiconductor die.

Front end module 208 includes a host interface 220 and a physical layer interface (PHY) 222 that provide the electrical interface with the host or next level storage controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 typically facilitates transfer for data, control signals, and timing signals.

Back end module 210 includes an error correction code (ECC) engine 224 that encodes the data bytes received from the host, and decodes and error corrects the data bytes read from the non-volatile memory. In one embodiment, ECC engine 224 is able to determine a FBC. The ECC engine 224 may employ a wide variety of error correcting codes, such as a low-density parity-check (LDPC) code. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of system 100 illustrated in FIG. 3 include media management layer 238, which performs wear leveling of memory cells of non-volatile memory die 108. System 100 also includes other discrete components 240, such as external electrical interfaces, external RAM, resistors, capacitors, or other components that may interface with controller 122. In alternative embodiments, one or more of the physical layer interface 222, RAID module 228, media management layer 238 and buffer management/bus controller 214 are optional components that are not necessary in the controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126. As described below, erratic bits may be identified and recorded using the MML 238. This recording of erratic bits can be used for evaluating the health of blocks and/or word lines (the memory cells on the word lines).

Controller 122 may interface with one or more memory dies 108. In one embodiment, controller 122 and multiple memory dies (together comprising non-volatile storage system 100) implement a solid state drive (SSD), which can emulate, replace or be used instead of a hard disk drive inside a host, as a NAS device, laptop, tablet, etc. Additionally, the SSD need not be made to work as a hard drive.

Figure 3A:
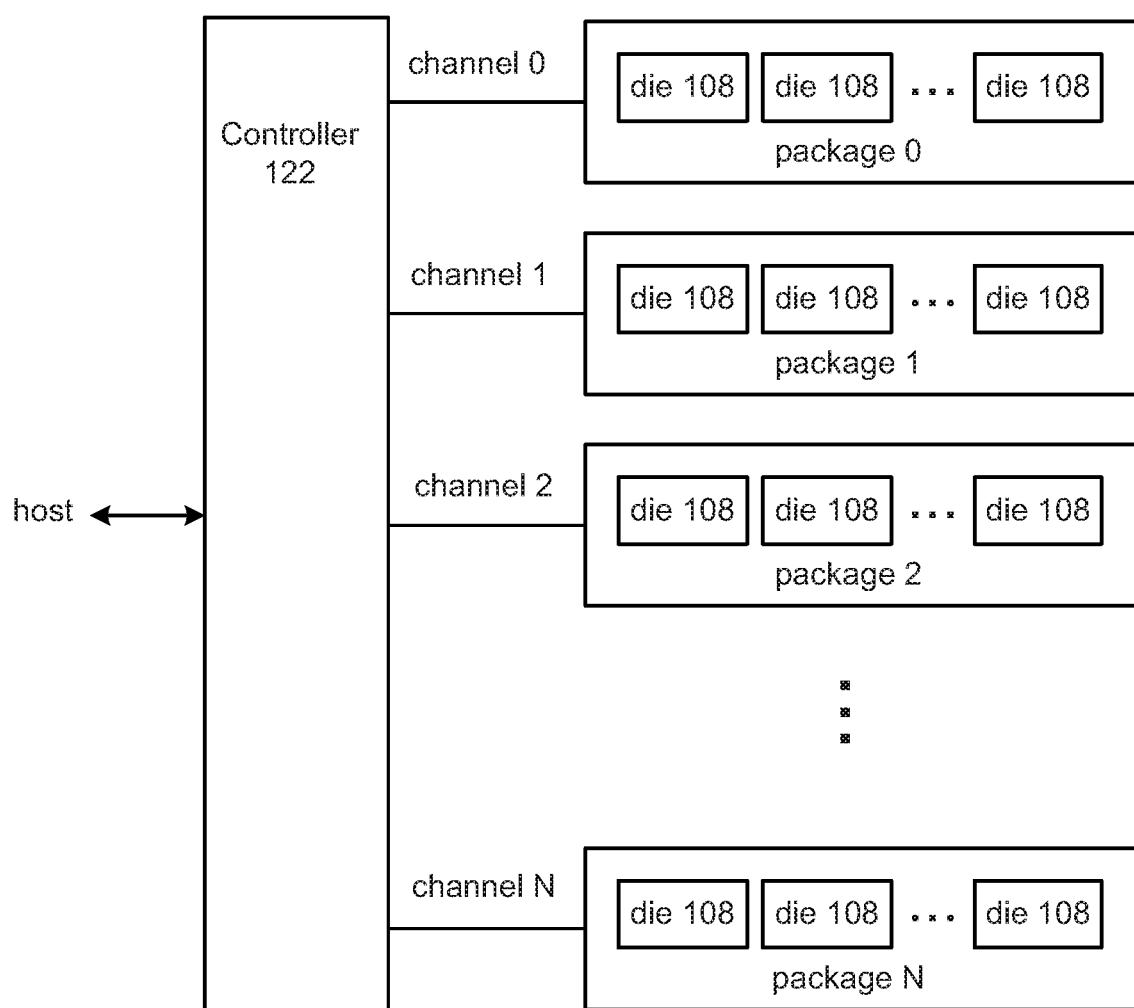
FIG. 3A is a block diagram depicting one embodiment of a memory system.

Some embodiments of a non-volatile storage system will include one memory die 108 connected to one controller 122. However, other embodiments may include multiple memory die 108 in communication with one or more controllers 122. In one example, depicted in FIG. 3A, the multiple memory die can be grouped into a set of memory packages. Each memory package includes one or more memory die in communication with controller 122. FIG. 6 shows N+1 memory packages (package 0-package N), and N+1 channels (channel 0-channel N) for communication between controller 122 and the memory dies 108 of respective memory packages 0-N. In one embodiment, a memory package includes a printed circuit board (or similar structure) with one or more memory die 108 mounted thereon. In some embodiments, a memory package can include molding material to encase the memory dies 108 of the memory package. In one embodiment, a memory package can be a single memory die 108. In some embodiments, controller 122 is physically separate from any of the memory packages.

Figure 4:
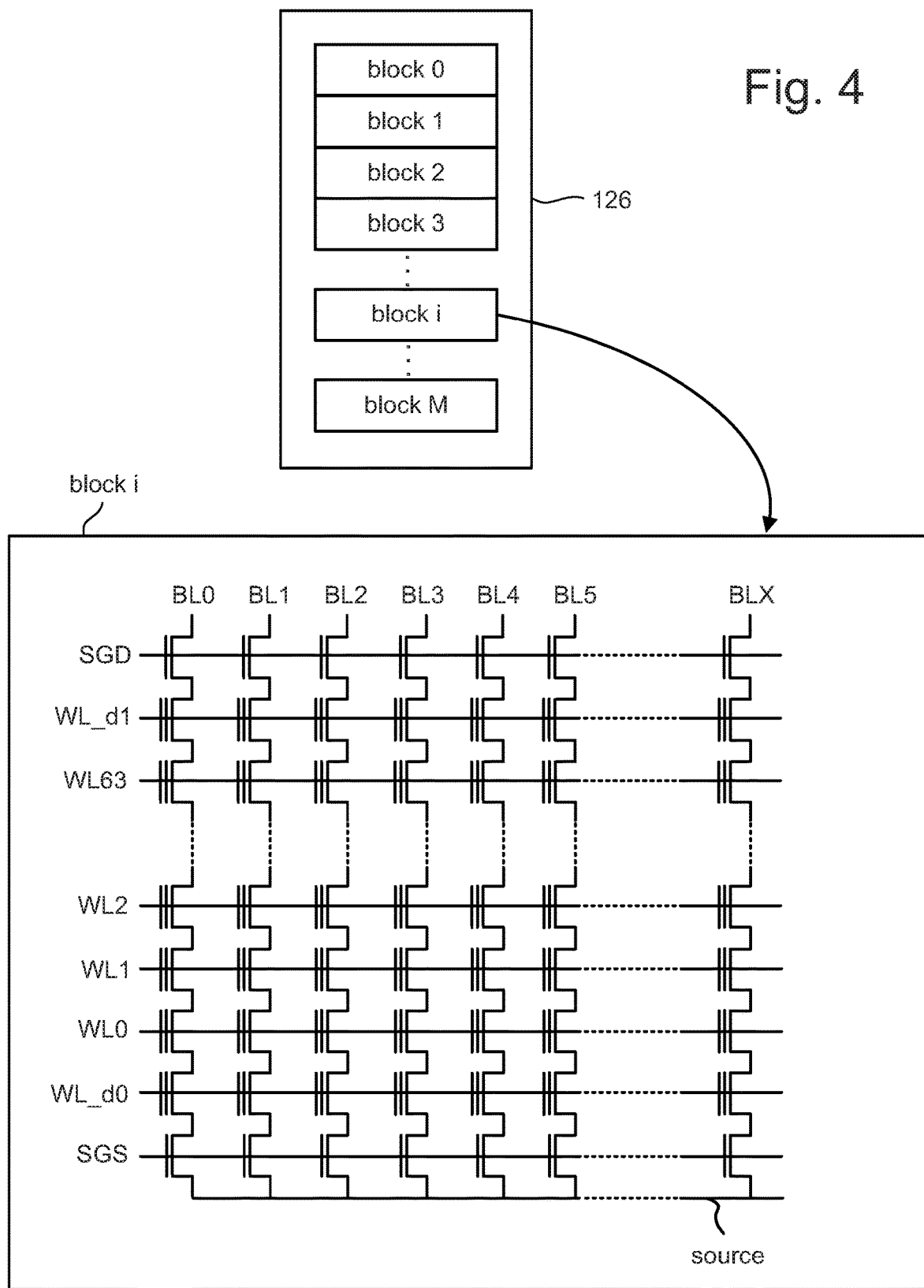
FIG. 4 depicts an exemplary structure of memory cell array 126.

FIG. 4 depicts an exemplary structure of memory cell array 126. In one embodiment, the array of memory cells is divided into M blocks of memory cells. The block is the unit of erase. That is, each block contains the minimum number of memory cells that are erased together. Each block is typically divided into a number of pages. A page is a unit of programming. One or more pages of data are typically stored in one row of memory cells. A page can store one or more sectors. A sector includes user data and overhead data. Overhead data typically includes parity bits of an Error Correction Code (ECC) that have been calculated from the user data of the sector. A portion of the controller calculates the ECC parity when data is being programmed into the array, and also checks it when data is being read from the array. Alternatively, the ECCs and/or other overhead data are stored in different pages, or even different blocks, than the user data to which they pertain.

FIG. 4 also shows more details of one embodiment of block i of memory array 126. Block i includes X+1 bit lines and X+1 NAND strings. Block i also includes 64 data word lines (WL0-WL63), 2 dummy word lines (WL_d0 and WL_d1), a drain side select line (SGD) and a source side select line (SGS). One terminal of each NAND string is connected to a corresponding bit line via a drain select gate (connected to select line SGD), and another terminal is connected to the source line via a source select gate (connected to select line SGS). Because there are sixty four data word lines and two dummy word lines, each NAND string includes sixty four data memory cells and two dummy memory cells. In other embodiments, the NAND strings can have more or fewer than 64 data memory cells and more or fewer dummy memory cells. Data memory cells can store user or system data. Dummy memory cells are typically not used to store user or system data. Some embodiments do not include dummy memory cells.

In one embodiment, memory cells on some of the NAND strings are used for storing user data (both user data and ECCs and/or other overhead data), and memory cells on other NAND strings are used for storing memory system information. The memory cells that store used data may be referred to as user memory cells. Note that the user memory cells for a given word line may store what is commonly referred to as a codeword, which may comprise the user data and parity bits. The memory cells that store system data may be referred to as user memory cells. In one embodiment, the temperature codes are stored in system memory cells. Note that the temperature codes are not part of the codeword in such an embodiment. Hence, the temperature code can be read from the system memory cells without the need to read any of the user memory cells.

Figure 5:
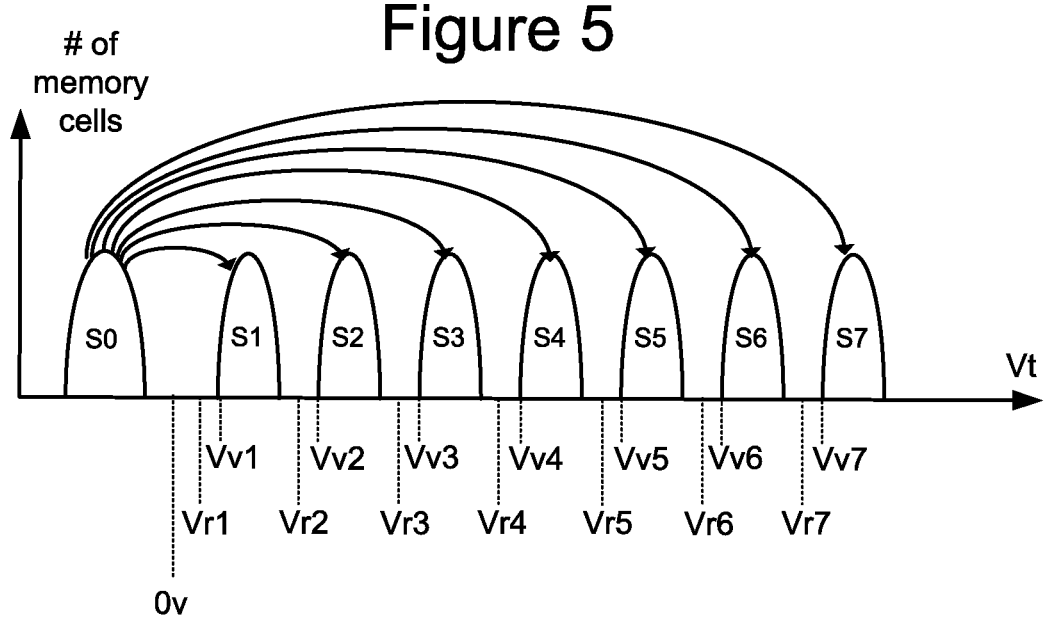
FIG. 5 illustrates example threshold voltage distributions for the memory cell array when each memory cell stores three bits of data.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S7 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, and Vr7, for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

Figure 6A:
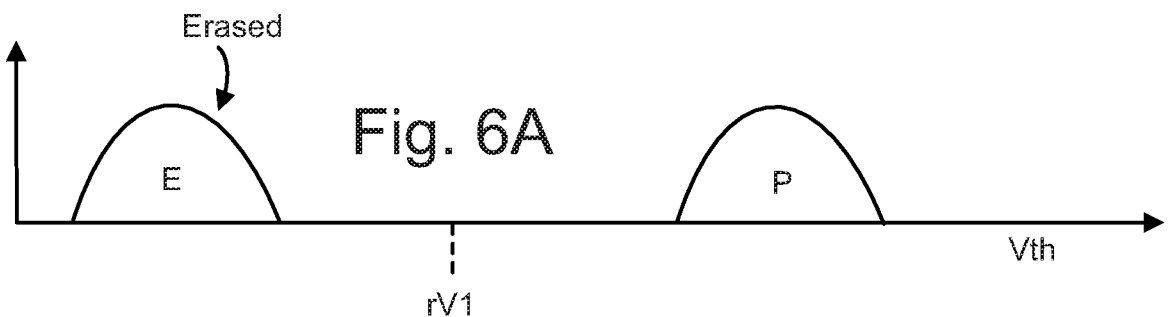
FIGS. 6A-6C illustrate an example of a population of two-state memory cells (Single Level Cells, or "SLC" cells).
Figure 6B:
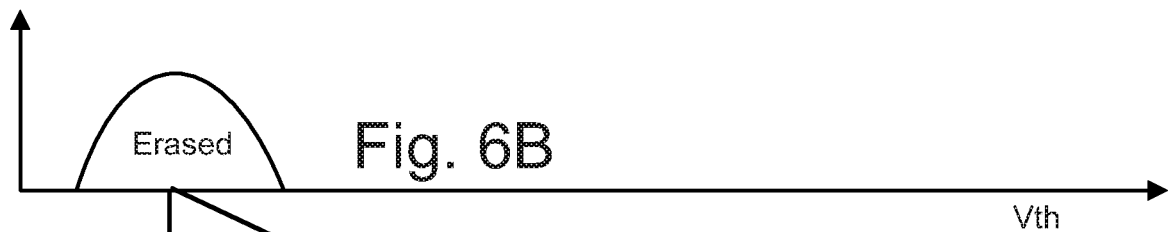
Figure 6C:
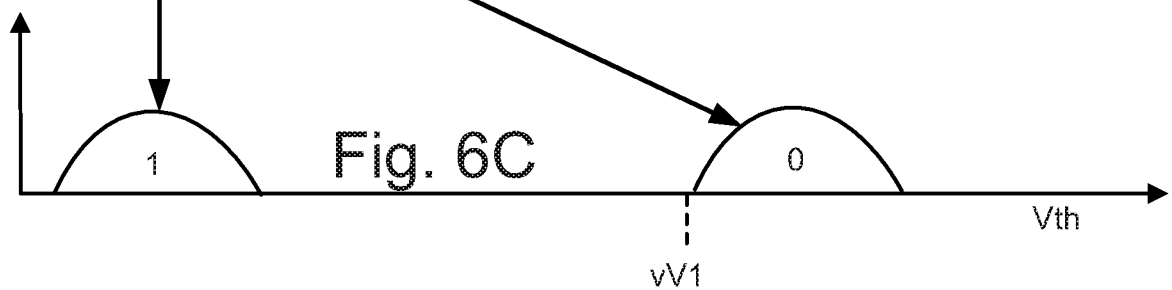

FIGS. 6A-6C illustrate an example of a population of two-state memory cells (Single Level Cells, or "SLC" cells). FIG. 6A illustrates how the population of memory cells are programmable into two distinct distributions of threshold voltages, an erased state, "E" and a programmed state, "P." Memory cells may be read by determining whether their threshold voltages are above or below a read voltage, rV1.

FIG. 6B illustrates the initial distribution of "erased" threshold voltages for an erased memory. FIG. 6C illustrates an example of the memory after the memory cells have been programmed. Essentially, a cell initially has an "erased" threshold voltage and programming will move it to a higher value into a zone demarcated by verify level vV1. In this way, each memory cell can be programmed to the programmed state or remain un-programmed in the "erased" state. Binary bits, or logic states, are associated with each distribution. In the example shown, the erased distribution is associated with a logic state "1" and the programmed distribution is associated with a logic state "0."

Figure 7A:
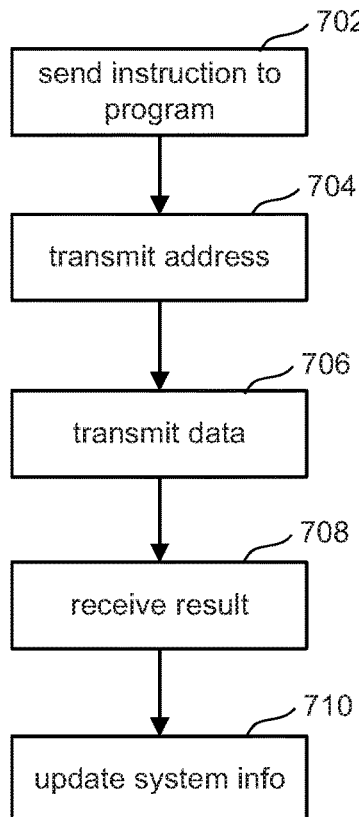
FIG. 7A is a flowchart describing one embodiment of a process for programming that is performed by controller.

FIG. 7A is a flowchart describing one embodiment of a process for programming that is performed by controller 122. In some embodiments, rather than have a dedicated controller, the host can perform the functions of the controller. In step 702, controller 122 sends instructions to one or more memory die 108 to program data. In step 704, controller 122 sends one or more addresses to one or more memory die 108. The one or more logical addresses indicate where to program the data. In step 706, controller 122 sends the data to be programmed to the one or more memory die 108. In step 708, controller 122 receives a result of the programming from the one or more memory die 108. In one embodiment, the controller polls the status of the memory die 108. Step 708 may thus include the status indicating that programming the in the memory die 108 is complete. Example results include that the data was programmed successfully, an indication that the programming operation failed, and indication that the data was programmed but at a different location, or other result. In step 710, in response to the result received in step 708, controller 122 updates the system information that it maintains. In one embodiment, the system maintains tables of data that indicate status information for each block. This information may include a mapping of logical addresses to physical addresses, which blocks/word lines are open/closed (or partially opened/closed), which blocks/word lines are bad, etc.

In some embodiments, before step 702, controller 122 would receive host data and an instruction to program from the host, and the controller would run the ECC engine 224 to create code words from the host data, as known in the art and described in more detail below. These code words are the data transmitted in step 706. Controller can also scramble the data to achieve wear leveling with respect to the memory cells.

Figure 7B:
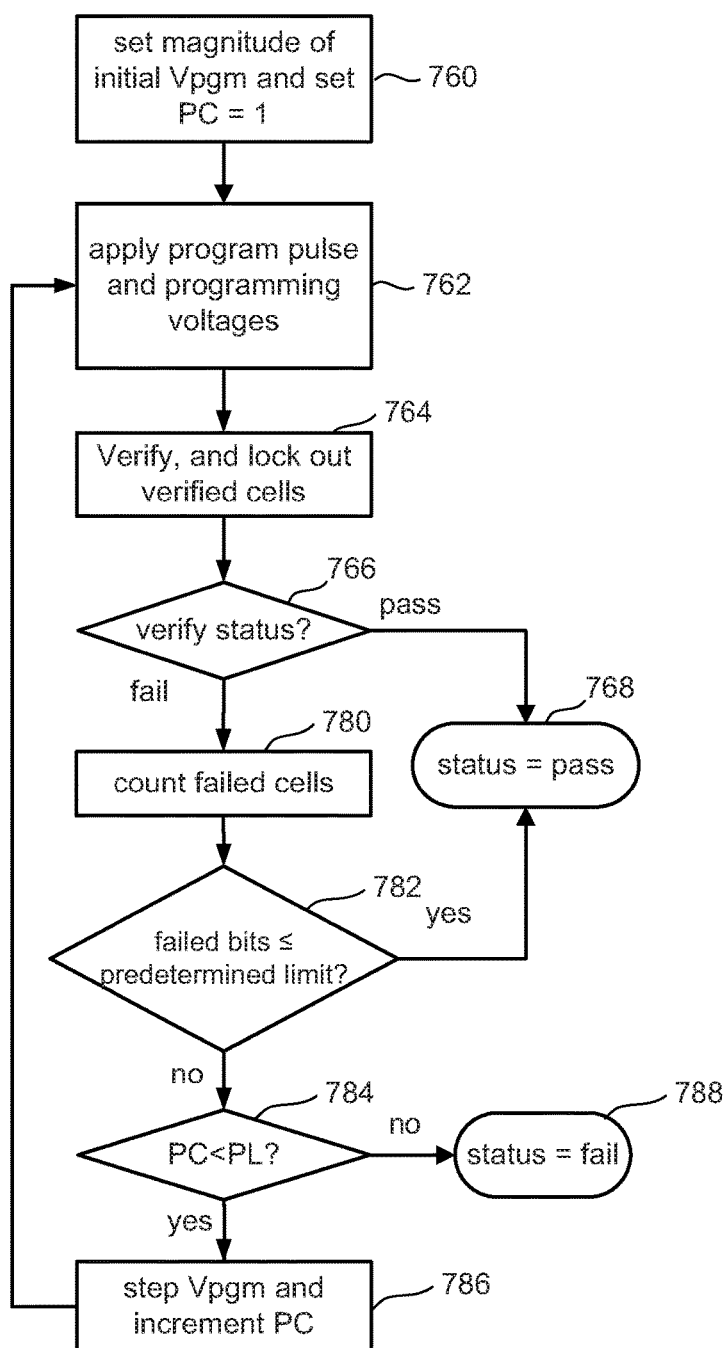
FIG. 7B is a flowchart describing one embodiment of a process for programming.

FIG. 7B is a flowchart describing one embodiment of a process for programming. The process of FIG. 7B is performed by the memory die in response to the steps of FIG. 7A (i.e., in response to the instructions, data and addresses from controller 122). In one example embodiment, the process of FIG. 7B is performed on memory die 108 using the one or more control circuits discussed above, at the direction of state machine 112. The process of FIG. 7B can also be used to implement the full sequence programming discussed above. Additionally, the process of FIG. 7B can be used to implement each phase of a multi-phase programming process.

Typically, the program voltage applied to the control gates (via a selected word line) during a program operation is applied as a series of program pulses. Between programming pulses are a set of verify pulses to perform verification. In many implementations, the magnitude of the program pulses is increased with each successive pulse by a predetermined step size. In step 760 of FIG. 7B, the programming voltage (Vpgm) is initialized to the starting magnitude (e.g., ~12-16V or another suitable level) and a program counter PC maintained by state machine 112 is initialized at 1. In step 762, a program pulse of the program signal Vpgm is applied to the selected word line (the word line selected for programming). In one embodiment, the group of memory cells being programmed concurrently are all connected to the same word line (the selected word line). The unselected word lines receive one or more boosting voltages (e.g., ~6-11 volts) to perform boosting schemes known in the art. If a memory cell should be programmed, then the corresponding bit line is grounded. On the other hand, if the memory cell should remain at its current threshold voltage, then the corresponding bit line is connected to Vdd to inhibit programming. In step 762, the program pulse is concurrently applied to all memory cells connected to the selected word line so that all of the memory cells connected to the selected word line are programmed concurrently. That is, they are programmed at the same time or during overlapping times (both of which are considered concurrent). In this manner all of the memory cells connected to the selected word line will concurrently have their threshold voltage change, unless they have been locked out from programming.

In step 764, the appropriate memory cells are verified using the appropriate set of verify reference voltages to perform one or more verify operations. In one embodiment, the verification process is performed by applying the testing whether the threshold voltages of the memory cells selected for programming have reached the appropriate verify reference voltage.

In step 766, it is determined whether all the memory cells have reached their target threshold voltages (pass). If so, the programming process is complete and successful because all selected memory cells were programmed and verified to their target states. A status of "PASS" is reported in step 768. If, in 766, it is determined that not all of the memory cells have reached their target threshold voltages (fail), then the programming process continues to step 780.

In step 780, the system counts the number of memory cells that have not yet reached their respective target threshold voltage distribution. That is, the system counts the number of memory cells that have, so far, failed the verify process. This counting can be done by the state machine, the controller, or other logic. In one implementation, each of the sense blocks will store the status (pass/fail) of their respective cells. In one embodiment, there is one total count, which reflects the total number of memory cells currently being programmed that have failed the last verify step. In another embodiment, separate counts are kept for each data state.

In step 782, it is determined whether the count from step 780 is less than or equal to a predetermined limit. In one embodiment, the predetermined limit is the number of bits that can be corrected by error correction codes (ECC) during a read process for the page of memory cells. If the number of failed memory cells is less than or equal to the predetermined limit, than the programming process can stop and a status of "PASS" is reported in step 768. In this situation, enough memory cells programmed correctly such that the few remaining memory cells that have not been completely programmed can be corrected using ECC during the read process. In some embodiments, step 780 will count the number of failed cells for each sector, each target data state or other unit, and those counts will individually or collectively be compared to a threshold in step 782.

In another embodiment, the predetermined limit can be less than the number of bits that can be corrected by ECC during a read process to allow for future errors. When programming less than all of the memory cells for a page, or comparing a count for only one data state (or less than all states), than the predetermined limit can be a portion (pro-rata or not pro-rata) of the number of bits that can be corrected by ECC during a read process for the page of memory cells. In some embodiments, the limit is not predetermined. Instead, it changes based on the number of errors already counted for the page, the number of program-erase cycles performed or other criteria.

If number of failed memory cells is not less than the predetermined limit, than the programming process continues at step 784 and the program counter PC is checked against the program limit value (PL). Examples of program limit values include 12, 20 and 30; however, other values can be used. If the program counter PC is not less than the program limit value PL, then the program process is considered to have failed and a status of FAIL is reported in step 788. This is one example of a program fault. If the program counter PC is less than the program limit value PL, then the process continues at step 786 during which time the Program Counter PC is incremented by 1 and the program voltage Vpgm is stepped up to the next magnitude. For example, the next pulse will have a magnitude greater than the previous pulse by a step size (e.g., a step size of 0.1-0.5 volts). After step 786, the process loops back to step 762 and another program pulse is applied to the selected word line so that another iteration (steps 762-686) of the programming process of FIG. 7B is performed.

In general, during verify operations and read operations, the selected word line is connected to a voltage (one example of a reference signal), a level of which is specified for each read operation (e.g., see read compare levels Vr1, Vr2, Vr3, Vr4, Vr5, Vr6, and Vr7, of FIG. 5) or verify operation (e.g. see verify target levels Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

In some embodiments, controller 122 receives a request from the host (or a client, user, etc.) to program host data (data received from the host) into the memory system. In some embodiments, controller 122 arranges the host data to be programmed into units of data. For example, controller 122 can arrange the host data into pages, word line units, blocks, jumbo blocks, or other units.

Figure 8A:
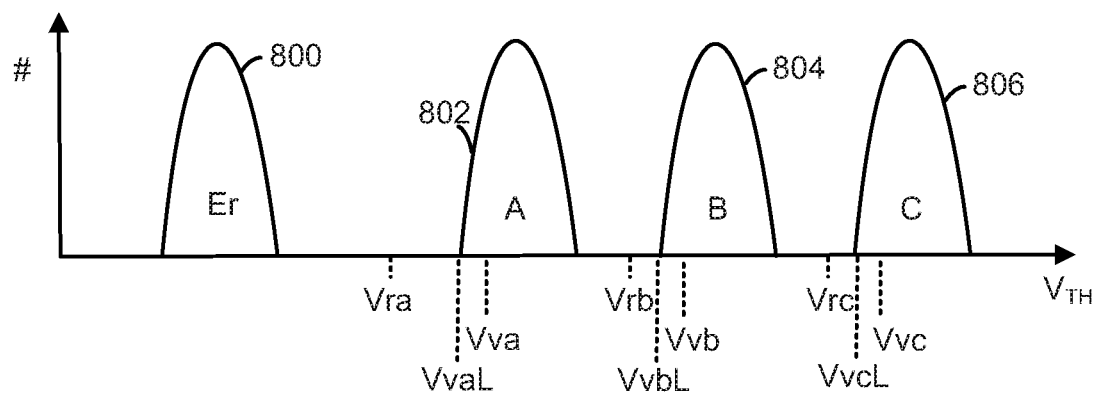
FIG. 8A depicts one embodiment of a set of threshold voltage distributions for a four-state memory device in which each storage element stores two bits of data.
Figure 8B:
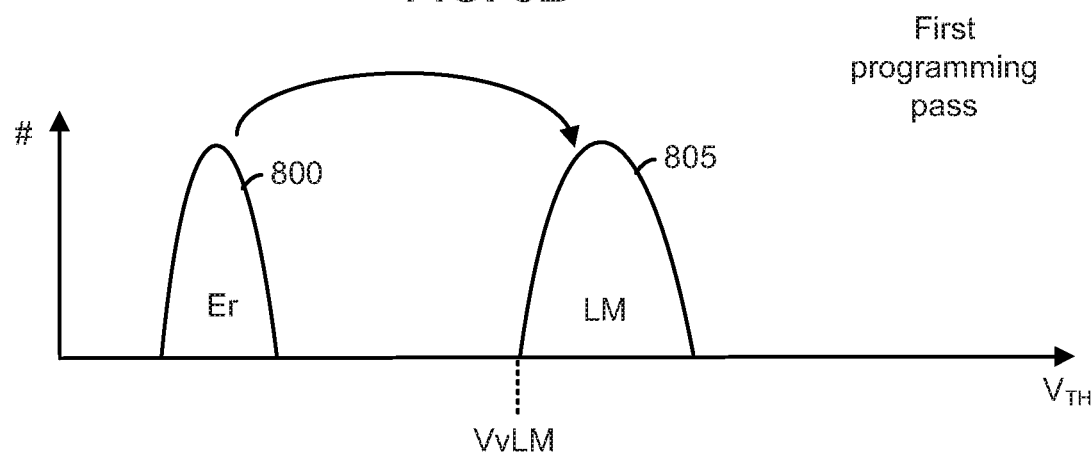
FIG. 8B depicts one embodiment of a first pass of a two-pass programming technique.
Figure 8C:
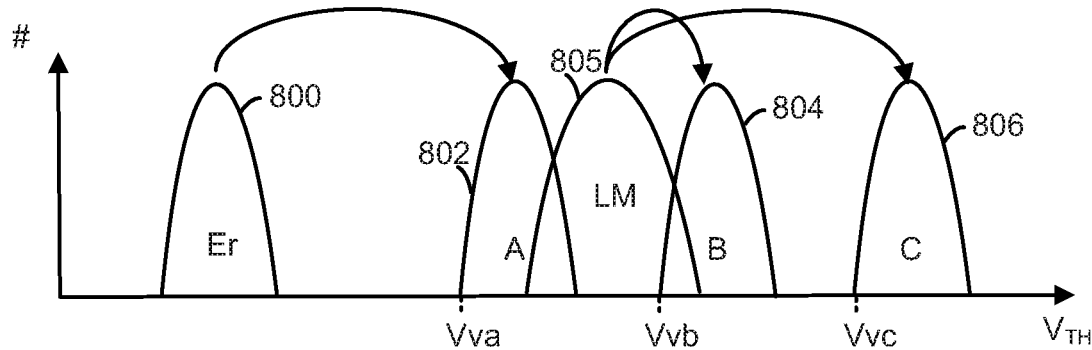
FIG. 8C depicts one embodiment of a second pass of the two-pass programming technique referred to in FIG. 8B.
Figure 8D:
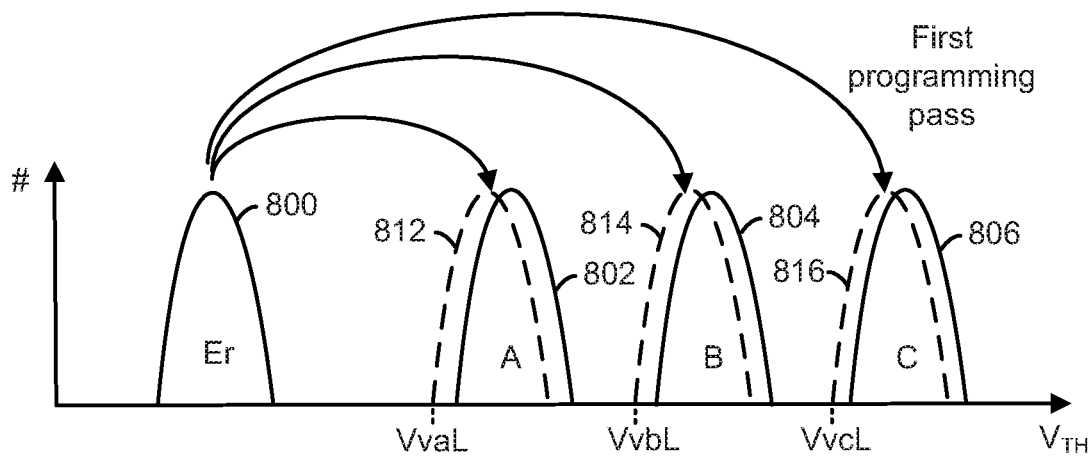
FIG. 8D depicts one embodiment of a first pass of another two-pass programming technique.
Figure 8E:
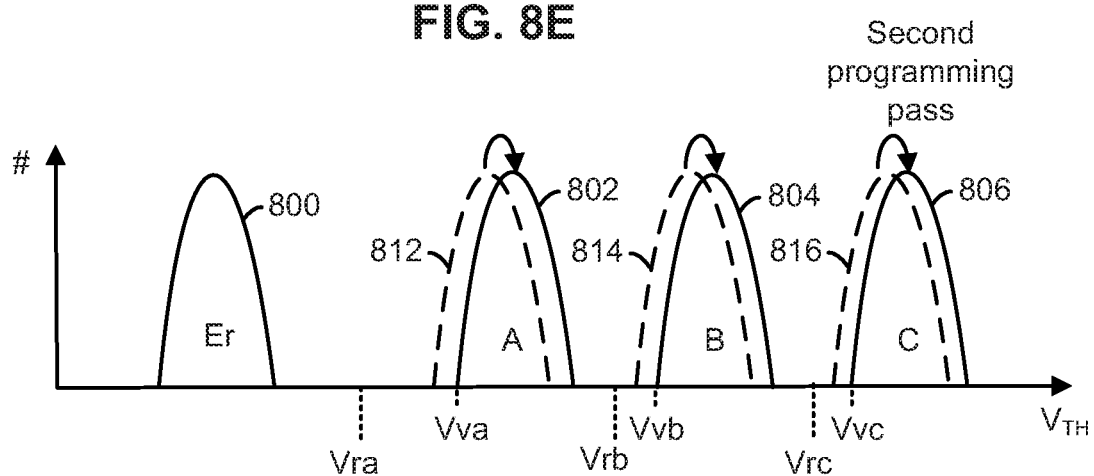
FIG. 8E depicts one embodiment of a second pass of the two-pass programming technique referred to in FIG. 8D.
Figure 8F:
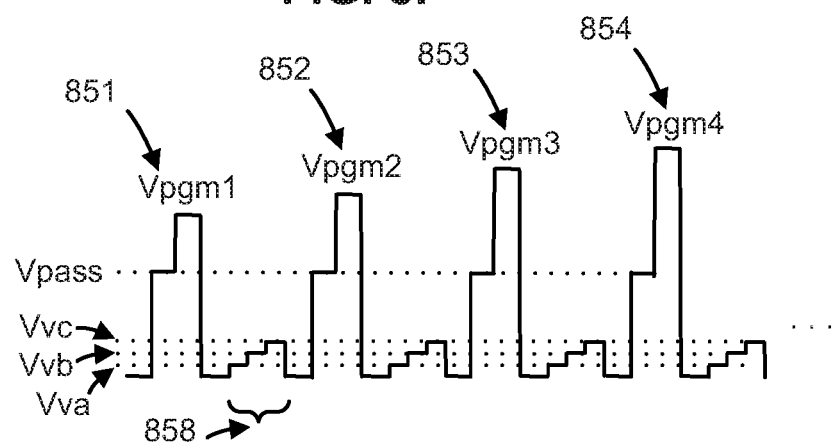
FIG. 8F depicts one embodiment of a series of program and verify pulses which are applied to a selected word line during a programming operation.

The programming process of FIG. 7B may be used to program memory cells to one bit per cell, two bits per cell, three bits per cell, four bits per cell, or some other number of bits per cell. Examples of three bits per cell and one bit per cell were discussed above in connection with FIGS. 5 and 6A-6C, respectively. FIGS. 8A-8C depict threshold voltage distributions and programming passes for one embodiment of programming memory cells to two bits per memory cell. FIGS. 8D-8F depict threshold voltage distributions and programming passes for another embodiment of programming memory cells to two bits per memory cell.

FIG. 8A depicts one embodiment of a set of threshold voltage distributions for a four-state memory device in which each storage element stores two bits of data. A first threshold voltage (Vth) distribution 800 is provided for erased (Er-state) storage elements. Three Vth distributions 802, 804 and 806 represent programmed states A, B and C, respectively. In one embodiment, the threshold voltages in the Er-state and the threshold voltages in the A, B and C distributions are positive. In another embodiment, the threshold voltage distribution for the Er-state is negative, while the threshold voltage distributions for the A-state, B-state and C-state distributions are positive.

Three read reference voltages, Vra, Vrb and Vrc, are also provided for reading data from storage elements. By testing whether the threshold voltage of a given storage element is above or below Vra, Vrb and Vrc, the system can determine the state, e.g., programming condition, the storage element is in.

Further, three verify reference voltages, Vva, Vvb and Vvc, are provided. When programming storage elements to the A-state, B-state or C-state, the system will test whether those storage elements have a threshold voltage greater than or equal to Vva, Vvb or Vvc, respectively.

In one embodiment, known as full sequence programming, storage elements can be programmed from the Er-state directly to any of the programmed states A, B or C. For example, a population of storage elements to be programmed may first be erased so that all storage elements in the population are in the Er-state. A series of program pulses may then be used to program storage elements directly into states A, B or C. While some storage elements are being programmed from the Er-state to the A-state, other storage elements are being programmed from the Er-state to the B-state and/or from the Er-state to the C-state.

Another option is to use low and high verify levels for one or more data states. For example, VvaL and Vva are lower and higher verify levels, respectively, for the A-state, VvbL and Vvb are lower and higher verify levels, respectively, for the B-state, and VvcL and Vvc are lower and higher verify levels, respectively, for the C-state. In some cases, VvcL is not used since reduced programming precision may be acceptable for the highest state. During programming, when the Vth of a storage element which is being programmed to the A-state as a target state exceeds VvaL, the programming speed of the storage element is slowed down, in a slow programming mode, such as by raising the associated bit line voltage to a level, e.g., 0.6-0.8 V, which is between a nominal program or non-inhibit level, e.g., 0 V and a full inhibit level, e.g., 4-6 V. This provides greater accuracy by avoiding large step increases in threshold voltage. When the Vth reaches Vva, the storage element is locked out from further programming. Similarly, when the Vth of a storage element which is being programmed to the B-state as a target state exceeds VvbL, the programming speed of the storage element is slowed down, and when the Vth reaches Vvb, the storage element is locked out from further programming. Optionally, when the Vth of a storage element which is being programmed to the C-state as a target state exceeds VvcL, the programming speed of the storage element is slowed down, and when the Vth reaches Vvc, the storage element is locked out from further programming. This programming technique has been referred to as a quick pass write or dual verify technique. Note that, in one approach, dual verify levels are not used for the highest state since some overshoot is typically acceptable for that state. Instead, the dual verify levels can be used for the programmed states, above the erased state, and below the highest state.

FIG. 8B depicts one embodiment of a first pass of a two-pass programming technique. In this example, a multi-state storage element stores data for two different pages: a lower page and an upper page. Four states are depicted by repeating the threshold voltage distributions 800, 802, 804 and 806 from FIG. 8A. These states, and the bits they represent, are: Er-state (11), A-state (01), B-state (00) and C-state (10). For Er-state, both pages store a "1." For A-state, the lower page stores a "1" and the upper page stores a "0." For B-state, both pages store "0." For C-state, the lower page stores "0" and the upper page stores "1." Note that although specific bit patterns have been assigned to each of the states, different bit patterns may also be assigned.

In the first programming pass, the lower page is programmed for a selected word line WLn. If the lower page is to remain data 1, then the storage element state remains at state Er (distribution 800). If the data is to be programmed to 0, then the threshold voltage of the storage elements on WLn are raised such that the storage element is programmed to an intermediate (LM or lower-middle) state (distribution 805).

FIG. 8C depicts one embodiment of a second pass of the two-pass programming technique referred to in FIG. 8B. The A-state storage elements are programmed from the Er-state distribution 800 to the A-state distribution 802, the B-state storage elements are programmed from the LM-state distribution 805 to the B-state distribution 804, and the C-state storage elements are programmed from the LM-state distribution 805 to the C-state distribution 806.

FIG. 8D depicts one embodiment of a first pass of another two-pass programming technique. In this example, referred to as foggy-fine (or course-fine) programming, the A-state, B-state and C-state storage elements are programmed from the Er-state to distributions 812, 814 and 816, respectively, using lower verify levels VvaL, VvbL and VvcL, respectively. This is the foggy (or course) programming pass. A relatively large program voltage step size may be used, for instance, to quickly program the storage elements to the respective lower verify levels.

FIG. 8E depicts one embodiment of a second pass of the two-pass programming technique referred to in FIG. 8D. The A-state, B-state and C-state storage elements are programmed from the respective lower distributions to respective final distributions 802, 804 and 806, respectively, using the nominal, higher verify levels Vva, Vvb and Vvc, respectively. This is the fine programming pass. A relatively small program voltage step size may be used, for instance, to slowly program the storage elements to the respective final verify levels while avoiding a large overshoot.

Although the programming examples depict four data states and two pages of data, the concepts described herein may be applied to other implementations with more or fewer than four states and more or fewer than two pages. For example, memory devices may utilize eight or sixteen states per storage element. Moreover, in the example programming techniques discussed herein, the Vth of a storage element may be raised gradually as it is programmed to a target data state. However, programming techniques may be used in which the Vth of a storage element may be lowered gradually as it is programmed to a target data state. Programming techniques which measure storage element current may be used as well. The concepts described herein may be adapted to the different programming techniques.

FIG. 8F depicts one embodiment of a series of program and verify pulses which are applied to a selected word line during a programming operation. A programming operation may include multiple program-verify iterations, in which each iteration applies one or more programming voltages followed by one or more verify voltages to the selected word line. In one embodiment, the programming voltages applied in a previous iteration may be stepped up in successive iterations. Moreover, the one or more programming voltages applied during a programming iteration may include a first portion which has a pass voltage (Vpass) level, e.g., 8-8 V, followed by a second, highest amplitude portion at a program level, e.g., 12-25 V. For example, a first, second, third and fourth program pulses 851, 852, 853 and 854 have program levels of Vpgm1, Vpgm2, Vpgm3 and Vpgm4, respectively. One or more verify voltages 858, such as verify voltages Vva, Vvb and Vvc, may be provided after each program pulse. In some cases, one or more initial program pulses are not followed by verify pulses because it is not expected that any storage elements have reached the lowest program state (e.g., A-state). Subsequently, in some cases, program iterations may use verify pulses for the A-state, followed by program iterations which use verify pulses for the A-states and B-states, followed by program iterations which use verify pulses for the B-states and C-states.

Figure 9:
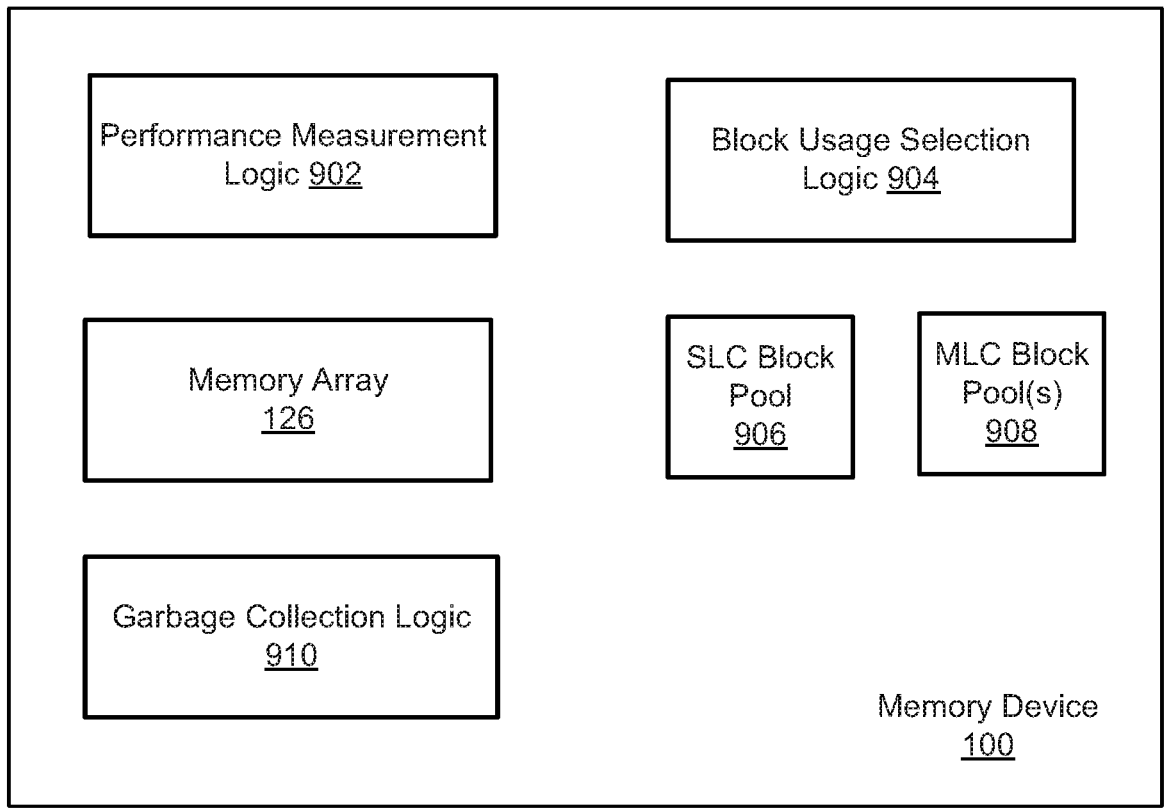
FIG. 9 is a block level diagram of one embodiment of a memory device.

FIG. 9 is a block level diagram of one embodiment of a memory device 100. The performance measurement logic 902 is configured to measure performance of memory cells in the memory array 126. The performance measurement logic 902 may determine performance for a group of memory cells such as memory cells associated with a word line. The performance measurement logic 902 may also determine performance for a group of memory cells such as a block of memory cells (or a portion of the block, such as a set of word lines). The performance measurement logic 902 may first determine the performance of a sub-group within the block, such as for a page or word line of memory cells within a block. The performance measurement logic 902 may then characterize the group (e.g., block) by, for example, averaging the performance metrics for the sub-groups. The performance measurement logic 902 is capable of measuring one or more performance metrics. The performance metrics may include, but are not limited to, programming time and fail bit count (FBC). In one embodiment, the FBC is measured using ECC engine 224. The term "programming time" is broadly defined herein to encompass many ways of characterizing how long or how many operations are needed to program a group of memory cells. A "programming time" can be measured in a variety of ways, including but not limited to: seconds, processor clock cycles, program loop counts, maximum magnitude of a program signal (e.g., maximum magnitude of a program voltage, maximum magnitude of a program current), and/or maximum duration of a program signal (e.g., maximum duration of a program voltage, maximum duration of a program current).

The block usage selection logic 904 is configured to select blocks to be used for memory array operations, based on the block performance metrics. The block usage selection logic 904 selects blocks to place into a single level cell (SLC) pool 906 based on one or more performance metrics, in one embodiment. The SLC block pool 906 contains a list of blocks that are to be used when storing a single bit per memory cell. In one embodiment, the blocks within the SLC block pool 906 are ranked in accordance with performance. In one embodiment, the blocks within the SLC block pool 906 are ranked in accordance with single bit per memory cell performance. The single bit per memory cell performance may include, but is not limited to, SLC programming time and/or SBC for memory cells programmed to multiple bits per memory cell. The SLC block pool 906 may indicate a status for each block such as whether the block is free, partially programmed, or closed (full programmed).

The block usage selection logic 904 selects blocks to place into one or more multi-level cell (MLC) pools 908 based on one or more performance metrics, in one embodiment. A variety of pools are possible for the one or more MLC pools. There might be a single pool of blocks to be used when storing more than one bit per memory cell. There might be a pool of blocks to be used when storing two bits per memory cell, and another pool of blocks to be used when storing more than two bits per memory cell. There might be a pool of blocks to be used when storing two bits per memory cell, a pool of blocks to be used when storing three bits per memory cell, and a pool of blocks to be used when storing three bits per memory cell. Many other variations are possible.

In one embodiment, the blocks within the one or more MLC pools 908 are ranked in accordance with performance. In one embodiment, the blocks within the MLC pool 908 are ranked in accordance with MLC performance. The MLC performance may include, but is not limited to, MLC programming time and/or FBC for memory cells programmed to multiple bits per memory cell.

The SLC block pool 906 and the one or more MLC block pools 908 are stored in the controller 122, in one embodiment. For example, SLC block pool 906 and the one or more MLC block pools 908 may be stored in ROM 122*a* on controller 122. The SLC block pool 906 and the one or more MLC block pools 908 could be stored in spare memory cells in the memory array 126. If so, the SLC block pool 906 and the one or more MLC block pools 908 could be read into the controller 122, and stored in RAM 122*b* upon power on.

The garbage collection logic 910 is configured to perform garbage collection of blocks in the memory array 126. Briefly, the garbage collection logic 910 may move valid pages (or other units of data) from a target block to another block. After moving all valid data in the target block, the target block may be erased. The target block may also be referred to as a "victim block." The erased block may then be added to a pool of free blocks. The garbage collection logic 910 either stores, or has access to, whether individual sub-groups (e.g., pages) are free, valid, or invalid.

In one embodiment, the garbage collection logic 910 determines which block to garbage collect based on performance metrics for the blocks. In one embodiment, when performing garbage collection for SLC blocks, the garbage collection logic 910 targets the blocks in the SLC block pool 906 having the highest performance metric. This returns the best performing SLC blocks to the free pool, which may improve system performance. Note that the block usage selection logic 904 may assist the garbage collection logic 910 with identifying the target blocks for collection.

In one embodiment, when performing garbage collection for MLC blocks, the garbage collection logic 910 targets the blocks in an MLC block pool 908 having the highest performance metric. This returns the best performing MLC blocks to the free pool, which may improve system performance. Note that there could be one or more MLC block pools 908.

The performance measurement logic 902, block selection usage logic 904, and garbage collection logic 910 may take the form of a packaged functional hardware unit (e.g., an electrical circuit) designed for use with other components, a portion of a program code (e.g., software or firmware) executable by a (micro) processor or processing circuitry that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include software stored in a processor readable device (e.g., memory) to program a processor for controller 122 to perform the functions described herein. The performance measurement logic 902, block selection usage logic 904, and garbage collection logic 910 depicted in FIG. 9 may (or may not) use the components of controller 122 depicted in FIG. 2 (i.e. RAM, ROM, processor, interface).

Figure 10:
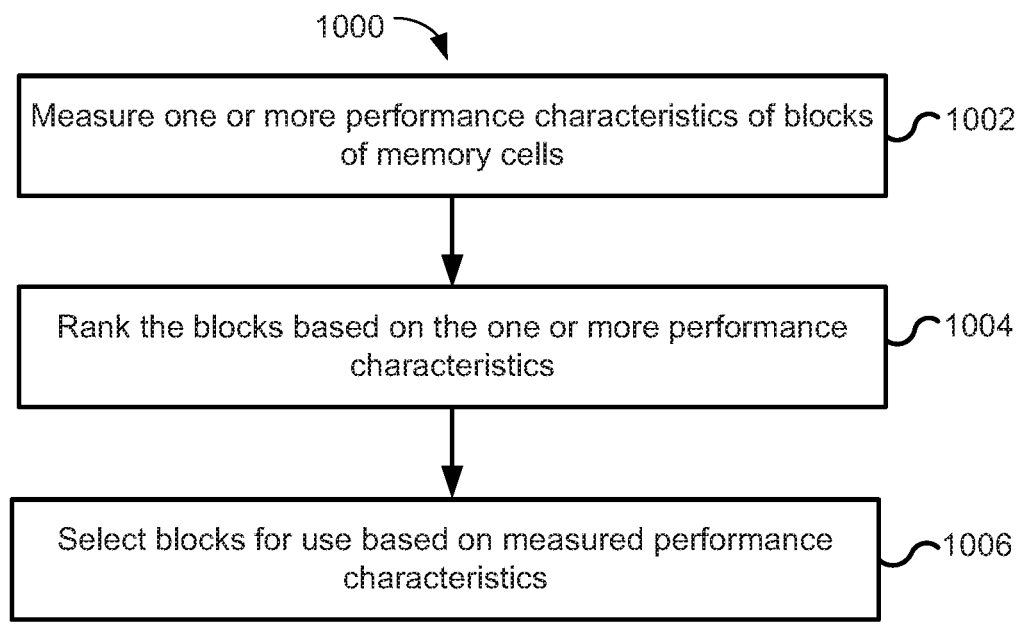
FIG. 10 is a flowchart of one embodiment of a process of operating non-volatile storage.

FIG. 10 is a flowchart of one embodiment of a process 1000 of operating non-volatile storage. The process 1000 may be performed by a combination of one or more of controller 122, control circuitry 110, state machine 112, decoders 114/124/132, power control 116, read/write circuits 128. In one embodiment, the process 1000 is performed by one or more of performance measurement logic 902, block usage selection 904, and garbage collection logic 910.

Step 1002 includes measuring one or more performance characteristics of blocks of memory cells. The one or more performance characteristics may be determined for each of the blocks. In one embodiment, the one or more performance characteristics are first determined for a group of memory cells in a block, such as a group of memory cells associated with a word line. Then, the block as a whole may be characterized based on the performance characteristics for the groups of memory cells in the block.

Step 1002 may include determining one or more performance metrics. If more than one performance metric is determined, these performance metrics may be combined to generate a single performance metric such that blocks can be ranked in terms of performance. The one or more performance characteristics may include, but are not limited to, programming time and fail bit count. In one embodiment, the one or more performance characteristics are defined in accordance with Equation 1:

$$T*(FBC)+(1-T)*T_{PROG} \quad (1)$$

In Equation 1, the metric for FBC may be unit-less. That is, FBC may just be a count. Note that since this may be an average, the FBC is not limited to being an integer. If the programming time is originally measured in seconds, the time might be scaled up or down. For example, the time in seconds could be multiplied by a constant (not shown in Equation 1), with the units of seconds not being included in Equation 1. Thus, the result of Equation 1 may be a real number and unit-less.

T could have a value between 0 and 1, inclusive. Thus, in an embodiment with with T=0, the performance characteristic is based on programming time, but not on FBC. In an embodiment with T=1, the performance characteristic is based on FBC, but not on programming time. In embodiment with T between 0 and 1 (non-inclusive) the performance is based on both programming time and FBC. The value of T may be chosen based on the type of memory. For example, the value of T may be different for a solid state drive (SSD), than for an embedded memory card.

Step 1004 includes ranking the blocks based on the one or more performance characteristics. In one embodiment, the ranking is based on Equation 1. In one embodiment, blocks are first ranked based on single bit per memory cell performance. In one embodiment, blocks with the best single bit per memory cell performance are selected for SLC use (such as being placed in SLC block pool 906). Then, a subset of the blocks not selected for SLC use may be ranked based on multi-bit per memory cell performance.

Step 1006 includes selecting blocks for use based on the measured one or more performance characteristics. In one embodiment, step 1006 includes placing blocks into an SLC block pool 906 and one or more MLC block pools 908, based on the measured one or more performance characteristics. In one embodiment, step 1006 includes selecting a block to program data into based on one or more performance characteristics. For example, if an SLC block is needed, the SLC block can be selected from the SLC block pool 906 based on performance ranking of the blocks in the SLC block pool 906. In one embodiment, step 1006 includes targeting a block for garbage collection based on the measured one or more performance characteristics. For example, if garbage collection is to be performed on MLC blocks, the highest performance MLC block can be targeted for garbage collection.

Figure 11A:
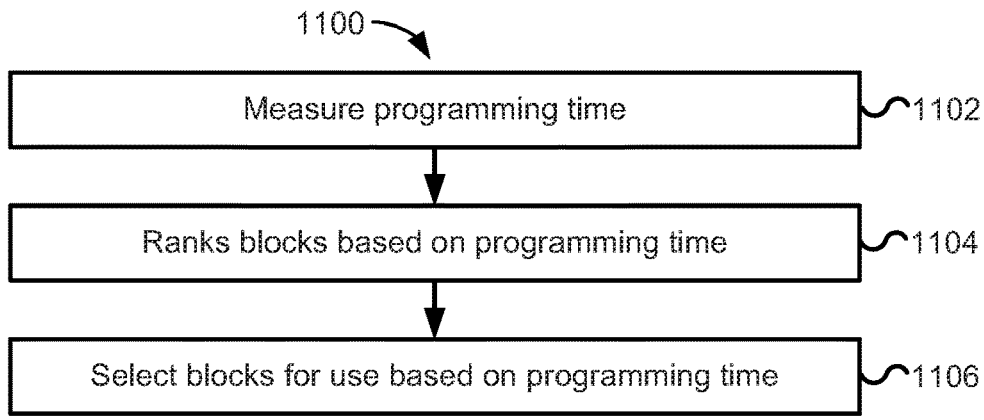
FIG. 11A is one embodiment of a process of selecting blocks for use based on programming time.
Figure 11B:
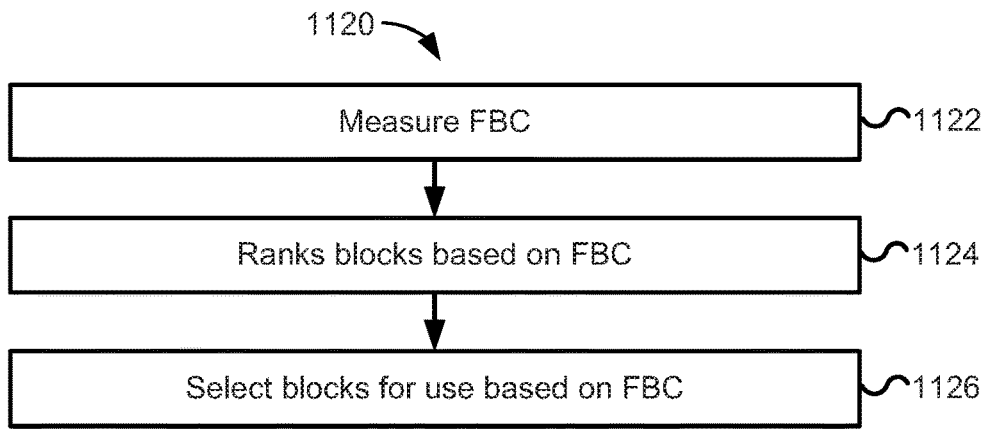
FIG. 11B is one embodiment of a process of selecting blocks for use based on fail bit count.
Figure 11C:
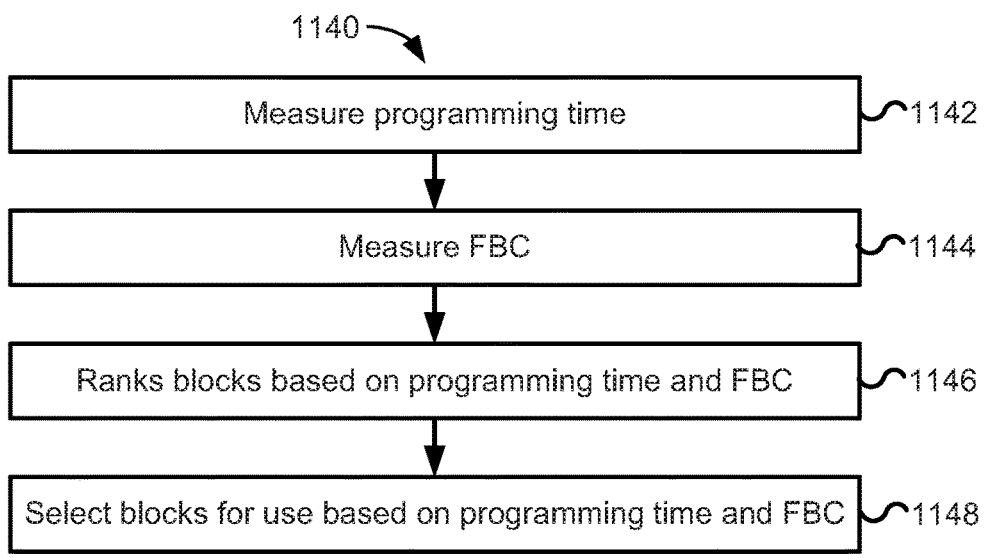
FIG. 11C is one embodiment of a process of selecting blocks for use based on both programming time and FBC.

As noted in step 1002 of process 1000, the one or more performance characteristics may include, but are not limited to, one or more of programming time or fail bit count. FIGS. 11A-11C depict flowcharts to provide further details of some embodiments of process 1000.

FIG. 11A is one embodiment of a process 1100 of selecting blocks for use based on programming time. The process is one embodiment of process 1000. The process 1100 may be performed by a combination of one or more of controller 122, control circuitry 110, state machine 112, decoders 114/124/132, power control 116, read/write circuits 128. In one embodiment, the process 1000 is performed by one or more of performance measurement logic 902, block usage selection 904, and garbage collection logic 910.

Step 1102 includes measuring a programming time for blocks of memory cells. The programming time may be first measured for groups of memory cells. For example, a block may be divided into a number of word lines. The memory cells on one word line may be programmed at a time. Thus, a programming time may be calculated for each word line in a block. Then, a programming time that characterizes the block may be calculated based on the word line programming times. As one example, the word line programming times are averaged. The average is a mathematical mean of the word line programming times, in one embodiment. The average is a mathematical median of the word line programming times, in one embodiment.

In one embodiment, the controller 122 measures the programming time. As one example, the controller 122 polls status of the memory die 108 to measure programming time. For example, a timer might be started and stopped responsive to two steps in the process of FIG. 7A. For example, the controller 122 might start the timer in response to sending the program instruction to a memory die (e.g., step 702) and stop the timer in response to receiving a result from the memory die (e.g., step 708). The result may be that the aforementioned polling status indicates programming in the memory die is complete. The timer might be started at a different step, such as step 706 of FIG. 7A. Note that the steps in process 7A might be performed in a different order. The timer may be implemented in a variety of ways. The length of time could be measured based on clock cycles, or another method. Note that the controller 122 might take steps to assure that the program command is not delayed within the memory die by only sending the program command when the memory die is idle.

The length of a programming operation could also be measured on the memory die. For example, the memory die might start and stop a timer based on two steps in FIG. 7B. For example, the memory die might start a timer in response to step 760 and stop the timer in response to step 768.

However, note that the programming time could be measured by a technique other than a timer. With reference to FIG. 7B, the programming process may employ a programming operation that uses a number of program loops. In this case, the programming time may be measured on the memory die as the number of program loops. Step 1102 may employ a programming operation that increases a magnitude of a programming signal, such as a programming voltage, one or more times, such as the one of FIG. 7B. In this case, the programming time may be measured in terms of the maximum programming voltage (or other programming signal). Instead of increasing a magnitude of a programming voltage, some programming operations may increase a duration of the programming signal (e.g., increase the duration of the programming voltage one or more times). In this case, the programming time may be measured in terms of maximum duration of the programming voltage. The memory die may report the program loop count, maximum voltage, maximum duration, or other parameter to the controller.

Step 1102 may include performing a process such as the one of FIG. 7B one or more times. Note that although FIG. 7B is used for purpose of illustration, a different programming process can be used. When programming memory cells to one bit per memory cell, the process of FIG. 7B might be performed once. Also, when programming memory cells from an erased state directly to program states, the process of FIG. 7B might be performed once. For example, the process of FIG. 7B might be used just once when programming using the scheme depicted in FIG. 5.

However, with reference to the two pass programming technique depicted in FIGS. 8B and 8C, the process of FIG. 7B might be used once for each programming pass. Also, with reference to the two pass programming technique depicted in FIGS. 8D and 8E, the process of FIG. 7B might be used once for each programming pass. Note that sometimes there might be three programming passes. For example, an additional programming pass can be added to the example of FIGS. 8B and 8C to program three bits per memory cell. In cases in which there are multiple programming passes, the length of a programming operation might be based on the cumulative metric from each programming pass. For example, the length of the programming operation might be defined as the total number of program loops for both programming passes. The length could also be based on the total time to complete all programming passes. For example, the length could be calculated as the total time between steps 760 and 768 for however many times the process of FIG. 7B is performed on a group of memory cells.

Step 1104 includes ranking the blocks based on programming time. In one embodiment, blocks in the SLC block pool 906 are ranked against each other, and blocks in each of the one or more MLC block pools 908 are ranked against each other. The block usage selection logic 904 stores these rankings in a table, in one embodiment. Note that herein, when discussing ranking a block based on a performance measure such as programming time, it will be understood that the ranking may be based on average performance of groups of memory cells, such as word lines or pages, within the block.

Step 1106 includes selecting blocks for use based on programming time. In one embodiment, blocks having a shorter programming times are preferred. In one embodiment, if an SLC block is needed to write data to, the SLC block with the shortest programming time is selected from the SLC block pool 906. In one embodiment, a block having the shortest programming time is selected for garbage collection. In one embodiment, blocks having the shortest programming time are placed into an SLC block pool 906, with blocks having slower programming times placed into one or more MLC block pools 908. Further details are selecting blocks for use based on programming time are described below.

FIG. 11B is one embodiment of a process 1120 of selecting blocks for use based on fail bit count. The process is one embodiment of process 1000. The process 1120 may be performed by a combination of one or more of controller 122, control circuitry 110, state machine 112, decoders 114/124/132, power control 116, read/write circuits 128. In one embodiment, the process 1120 is performed by one or more of performance measurement logic 902, block usage selection 904, and garbage collection logic 910.

A fail bit is defined herein as a bit that when read back from a memory cell, before applying an error correction, is different from its intended program state. A fail bit count (FBC) refers to the total number of failed bits in some unit of data. In one embodiment, a FBC is determined for a codeword. The codeword could be one page of data plus party bits. The codeword is stored in some group of memory cells, such as one page of memory cells. Note that when storing more than one bit per memory cell, each memory cell could store one bit of each page. Hence, a given memory cell could be used to store a bit from more than one codeword. The codeword may be processed by an ECC engine, which is able to determine how many bits in the codeword are different from the intended program state. If the original data that was programmed into the memory cells is still available, the FBC may be determined by a comparison of the original data to the read back data (prior to performing error correction).

Step 1122 includes measuring a fail bit count for blocks of memory cells. The fail bit count may be first measured for groups of memory cells. For example, the data stored in a block may be programmed as a number of pages. A fail bit count might be determined for each page. Then, a fail bit count that characterizes the block may be calculated based on the fail bit count for each page. Note that unit for which a fail bit count is determined is not required to be a page. As one example, the fail bit counts for the different groups of memory cells in the block may be averaged. As one example, an average of the fail bit count for each page stored in the block may be determined. The average is a mathematical mean of the fail bit counts, in one embodiment. The average is a mathematical median of the fail bit counts, in one embodiment.

Step 1124 includes ranking the blocks based on FBC. In one embodiment, blocks in the SLC block pool 906 are ranked against each other, and blocks in each of the one or more MLC block pools 908 are ranked against each other. The block usage selection logic 904 stores these rankings in a table, in one embodiment. Note that herein, when discussing ranking a block based on a performance measure such as FBC, it will be understood that the ranking may be based on average performance of groups of memory cells within the block.

Step 1126 includes selecting blocks for use based on FBC. In one embodiment, blocks having a lower FBC are preferred. For example, a block with the lowest FBC may be selected for garbage collection. As another example, blocks with the lowest FBC may be placed into an SLC block pool 906, with blocks having higher FBCs placed into one or more MLC block pools 908. Further details are selecting blocks for use based on FBC are described below.

FIG. 11C is one embodiment of a process 1140 of selecting blocks for use based on both programming time and FBC. The process is one embodiment of process 1000. The process 1140 may be performed by a combination of one or more of controller 122, control circuitry 110, state machine 112, decoders 114/124/132, power control 116, read/write circuits 128. In one embodiment, the process 1000 is performed by one or more of performance measurement logic 902, block usage selection 904, and garbage collection logic 910.

Step 1142 is to measure programming time. Step 1142 may be performed in a similar manner as step 1102 in process 1100.

Step 1144 is to measure FBC. Step 1144 may be performed in a similar manner as step 1122 in process 1120.

Step 1146 is to rank blocks based on both programming time and FBC. In one embodiment, Equation 1 is used. In an embodiment in which Equation 1 is used in step 1146, the value for T is between 0 and 1, non-inclusive. That is, the value of T cannot be equal to 0 or 1, in this embodiment.

In one embodiment of step 1146, programming time is given the main priority, with FBC used to break ties between blocks. For example, the blocks are first ranked from fastest to slowest based on program time. However, blocks that are tied in programming time, are ranked from lowest to highest FBC. In one embodiment, the programming time is quantized into windows, such that a tie is defined as blocks within the same time window. The windows can be defined in a variety of ways. For example, each window could be "x" milliseconds. If programming time is defined as a number of program loops, then each window may be one program loop. Hence, all blocks have the same number of program loops can be ranked against each other based on FBC.

Step 1148 includes selecting blocks for use based on programming time and FBC. For example, a block with the lowest value for Equation 1 may be selected for garbage collection. As another example, blocks with the lowest value for Equation 1 may be placed into an SLC block pool 906. Further details are selecting blocks for use based on both programming time and FBC are described below.

Figure 12A:
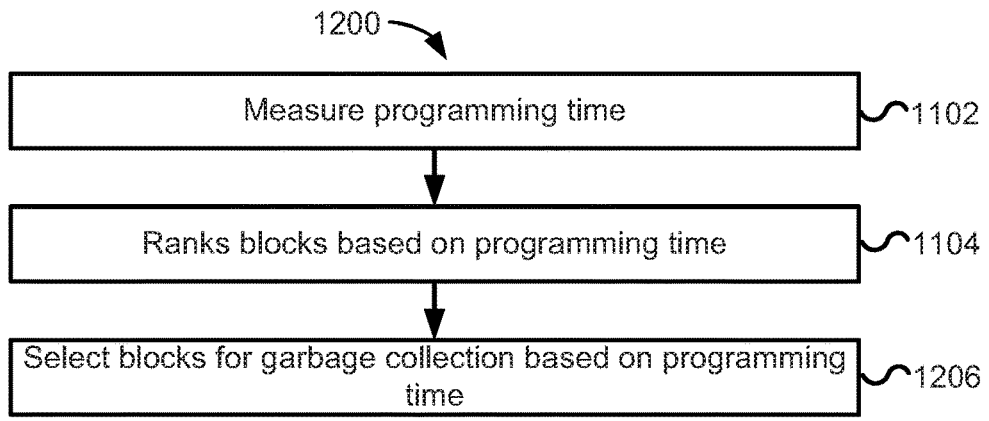
FIG. 12A is one embodiment of a process of selecting blocks for garbage collection based on programming time.

FIG. 12A is one embodiment of a process 1100 of selecting blocks for garbage collection based on programming time. Process is one embodiment of process 1000. Process is one embodiment of process 1100. The process 1200 may be performed by a combination of one or more of controller 122, control circuitry 110, state machine 112, decoders 114/124/132, power control 116, read/write circuits 128. In one embodiment, the process 1000 is performed by one or more of performance measurement logic 902, block usage selection 904, and garbage collection logic 910.

Process 1200 begins with steps 1102 and 1104. Those steps have already been described with respect to process 1100.

Step 1206 includes selecting one or more blocks for garbage collection based on programming time. Note that the garbage collection of a single block may be spread out over time. For example, first the valid data may be migrated to another block. This migration stage may be spread out over time. It is not until all valid data has been moved that the block is erased and hence made available to store new data. Hence, the memory system may have a number of blocks that are presently in the process of garbage collection. Thus, the memory system may identify one or more blocks for garbage collection. This set of one or more blocks that are identified for garbage collection will be referred to herein as "victim block(s)."

In one embodiment, the order in which blocks are garbage collected is based on programming time. For example, the order in which blocks are added to the set of victim block(s) is based on programming time. In one embodiment, the set of victim block(s) contains the fastest programming blocks.

Note that in one embodiment, process 1200 is based on SLC programming time. In such a case, steps 1102-1206 may all be based on SLC programming time. In one embodiment, process 1200 is based on MLC programming time. In such a case, steps 1102-1206 may all be based on MLC programming time.

Figure 12B:
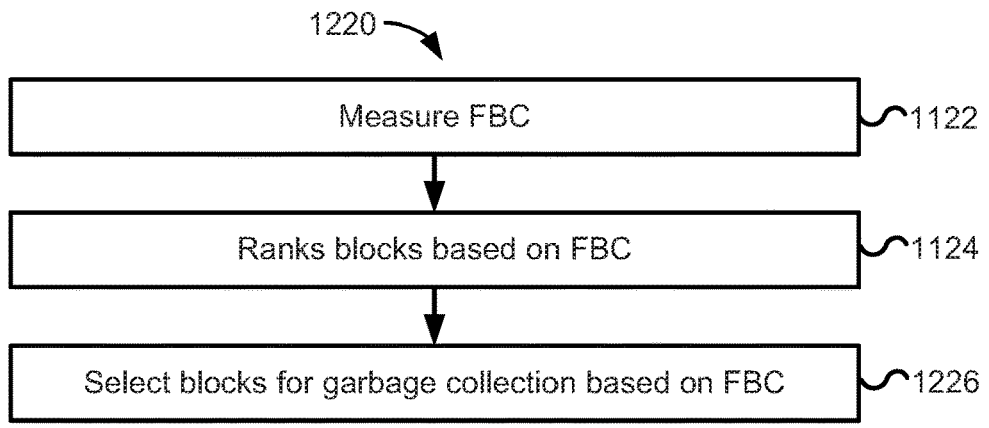
FIG. 12B is one embodiment of a process of selecting blocks for garbage collection based on FBC.

FIG. 12B is one embodiment of a process 1220 of selecting blocks for garbage collection based on FBC. Process is one embodiment of process 1000. Process is one embodiment of process 1120. The process 1220 may be performed by a combination of one or more of controller 122, control circuitry 110, state machine 112, decoders 114/124/132, power control 116, read/write circuits 128. In one embodiment, the process 1000 is performed by one or more of performance measurement logic 902, block usage selection 904, and garbage collection logic 910.

Process 1220 begins with steps 1122 and 1124. Those steps have already been described with respect to process 1120.

Step 1226 includes selecting blocks for garbage collection based on FBC. In one embodiment, the order in which blocks are garbage collected is based on FBC. For example, the order in which blocks are added to the set of victim block(s) is based on FBC. For example, the next block that is added to the set of victim blocks is the block having the lowest FBC. In one embodiment, the set of victim block(s) contains the blocks having the lowest FBC.

Note that in one embodiment, process 1220 is based on FBC for memory cells programmed to one bit per cell. In such a case, steps 1122-1226 may all be based on SLC FBC. In one embodiment, process 1220 is based on FBC for memory cells programmed to multiple-bits per cell. In such a case, steps 1122-1226 may all be based on multiple-bit per cell FBC.

Figure 12C:
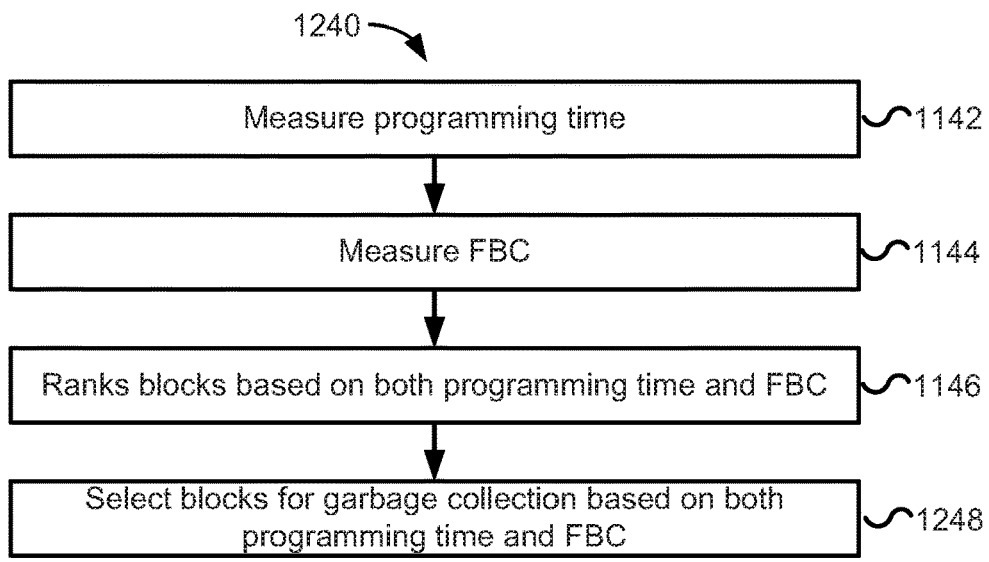
FIG. 12C is one embodiment of a process of selecting blocks for garbage collection based on programming time and FBC.

FIG. 12C is one embodiment of a process 1240 of selecting blocks for garbage collection based on programming time and FBC. Process 1240 is one embodiment of process 1000. Process 1240 is one embodiment of process 1140. The process 1240 may be performed by a combination of one or more of controller 122, control circuitry 110, state machine 112, decoders 114/124/132, power control 116, read/write circuits 128. In one embodiment, the process 1240 is performed by one or more of performance measurement logic 902, block usage selection 904, and garbage collection logic 910.

Process 1240 begins with steps 1142-1146. Those steps have already been described with respect to process 1140.

Step 1248 includes selecting blocks for garbage collection based on both programming time and FBC. In one embodiment, the order in which blocks are garbage collected is based on both programming time and FBC. For example, the order in which blocks are added to the set of victim block(s) is based on both programming time and FBC. For example, the next block that is added to the set of victim blocks is the block having the best metric that is based on both programming time and FBC. In one embodiment, the next block that is added to the set of victim blocks is the block having the highest value for Equation 1.

Note that in one embodiment, process 1240 is based on programming time and FBC for SLC programming. In such a case, steps 1142-1248 may all be based on SLC programming. In one embodiment, process 1240 is based on programming time and FBC for MLC programming. In such a case, steps 1142-1248 may all be based on MLC programming.

Figure 13A:
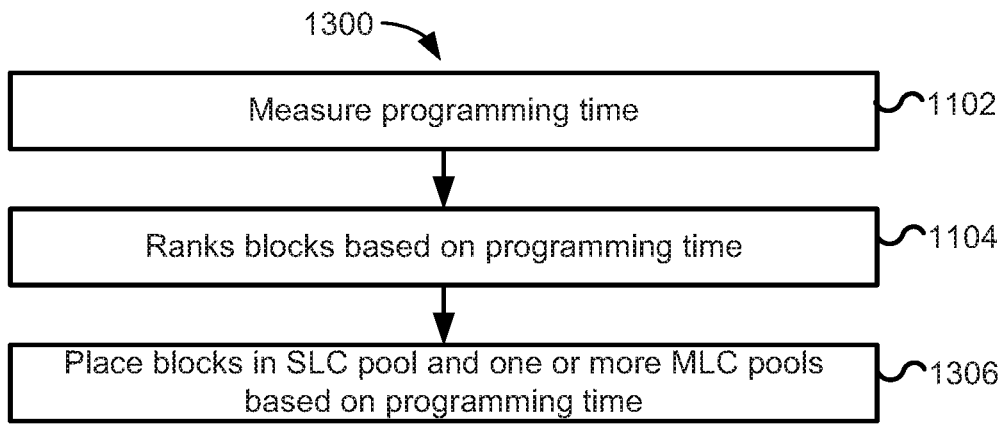
FIG. 13A is one embodiment of a process of placing blocks into an SLC block pool and one or more MLC block pools based on programming time.

FIG. 13A is one embodiment of a process 1300 of placing blocks into an SLC block pool 906 and one or more MLC block pools 908 based on programming time. Process 1300 is one embodiment of process 1000. Process is one embodiment of process 1100. The process 1300 may be performed by a combination of one or more of controller 122, control circuitry 110, state machine 112, decoders 114/124/132, power control 116, read/write circuits 128. In one embodiment, the process 1300 is performed by one or more of performance measurement logic 902, block usage selection 904, and garbage collection logic 910.

Process 1300 begins with steps 1102 and 1104. Those steps have already been described with respect to process 1100.

Step 1306 includes placing blocks into an SLC block pool 906 and one or more MLC block pools 908 based on programming time. In one embodiment, blocks having a shorter programming times are preferred for the SLC block pool 906. In one embodiment, blocks having the shortest programming time are placed into an SLC block pool 906, with blocks having slower programming times placed into one or more MLC block pools 908. Further details are selecting blocks for an SLC block pool 906 based on programming time are described below.

Note that in one embodiment, process 1300 is based on SLC programming time. In such a case, steps 1102-1306 may all be based on SLC programming time. In one embodiment, process 1300 is based on MLC programming time. In such a case, steps 1102-1306 may all be based on MLC programming time.

Figure 13B:
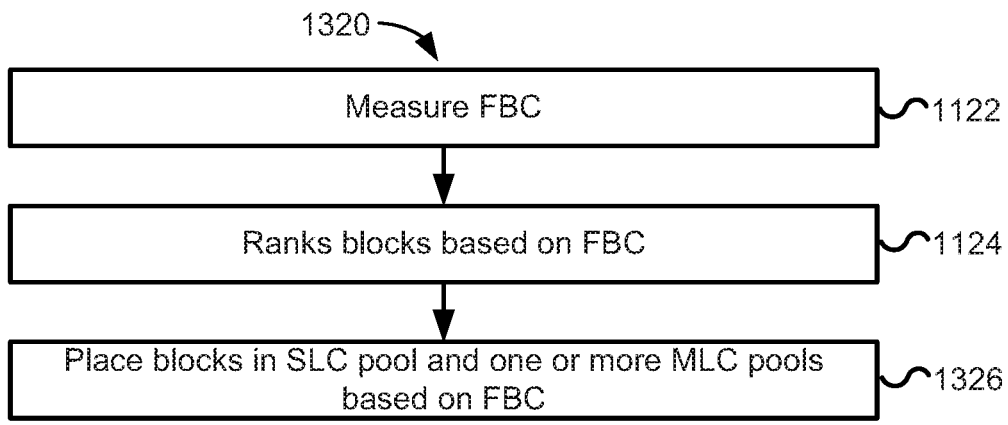
FIG. 13B is one embodiment of a process of placing blocks into an SLC block pool and one or more MLC block pools based on FBC.

FIG. 13B is one embodiment of a process 1320 of placing blocks into an SLC block pool 906 and one or more MLC block pools 908 based on FBC. Process 1320 is one embodiment of process 1000. Process is one embodiment of process 1100. The process 1320 may be performed by a combination of one or more of controller 122, control circuitry 110, state machine 112, decoders 114/124/132, power control 116, read/write circuits 128. In one embodiment, the process 1320 is performed by one or more of performance measurement logic 902, block usage selection 904, and garbage collection logic 910.

Process 1320 begins with steps 1102 and 1104. Those steps have already been described with respect to process 1100.

Step 1326 includes placing blocks into an SLC block pool 906 and one or more MLC block pools 908 based on FBC. In one embodiment, blocks having a lower FBC are preferred for the SLC block pool 906. In one embodiment, blocks having the lowest FBCs are placed into an SLC block pool 906, with blocks having higher FBCs placed into one or more MLC block pools 908. Further details are selecting blocks for an MLC block pool 908 based on FBC are described below.

Figure 13C:
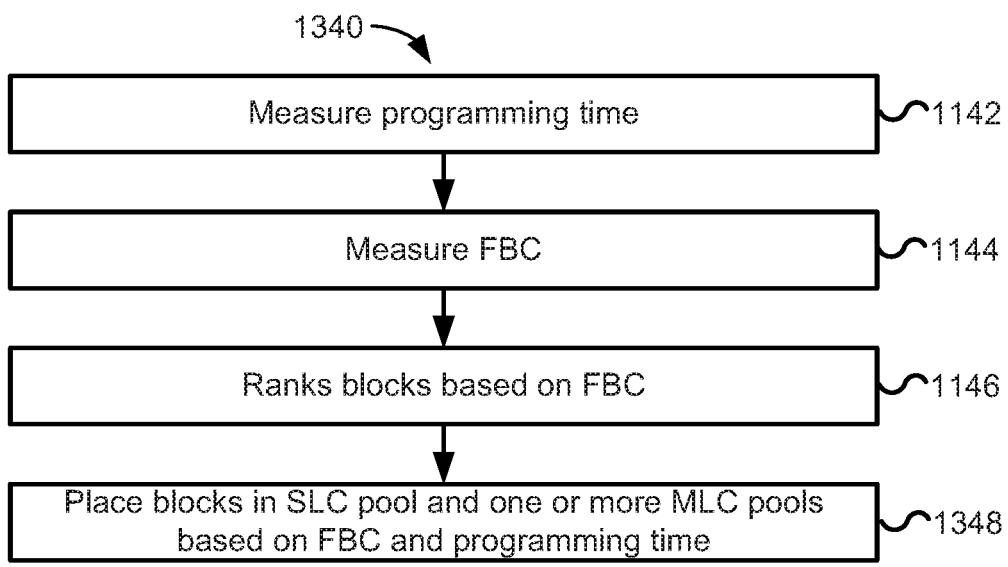
FIG. 13C is one embodiment of a process of placing blocks into an SLC block pool and one or more MLC block pools based on programming time and FBC.

Note that in one embodiment, process 1320 is based on FBC for memory cells programmed to one bit per cell. In such a case, steps 1122-1326 may all be based on SLC FBC. In one embodiment, process 1320 is based on FBC for memory cells programmed to multiple-bits per cell. In such a case, steps 1122-1326 may all be based on multiple-bit per cell FBC FIG. 13C is one embodiment of a process 1340 of placing blocks into an SLC block pool 906 and one or more MLC block pools 908 based on programming time and FBC. Process 1340 is one embodiment of process 1000. Process is one embodiment of process 1100. The process 1300 may be performed by a combination of one or more of controller 122, control circuitry 110, state machine 112, decoders 114/124/132, power control 116, read/write circuits 128. In one embodiment, the process 1340 is performed by one or more of performance measurement logic 902, block usage selection 904, and garbage collection logic 910.

Process 1340 begins with steps 1102 and 1104. Those steps have already been described with respect to process 1100.

Step 1346 includes placing blocks into an SLC block pool 906 and one or more MLC block pools 908 based on both programming time and FBC. In one embodiment of step 1346, programming time is given the main priority, with FBC used to break ties between blocks. For example, the blocks are first ranked from fastest to slowest based on program time. However, blocks that are tied in programming time, are ranked from lowest to highest FBC. In one embodiment, the programming time is quantized into windows, such that a tie is defined as blocks within the same time window. The windows can be defined in a variety of ways. For example, each window could be "x" milliseconds. If programming time is defined as a number of program loops, then each window may be one program loop. Hence, all blocks have the same number of program loops can be ranked against each other based on FBC. In one embodiment, Equation 1 is used in step 1348. Blocks with the lowest value for Equation 1 may be placed into an SLC block pool 906.

Note that in one embodiment, process 1340 is based on programming time and FBC for SLC programming. In such a case, steps 1142-1348 may all be based on SLC programming. In one embodiment, process 1340 is based on programming time and FBC for MLC programming. In such a case, steps 1142-1348 may all be based on MLC programming.

Figure 14A:
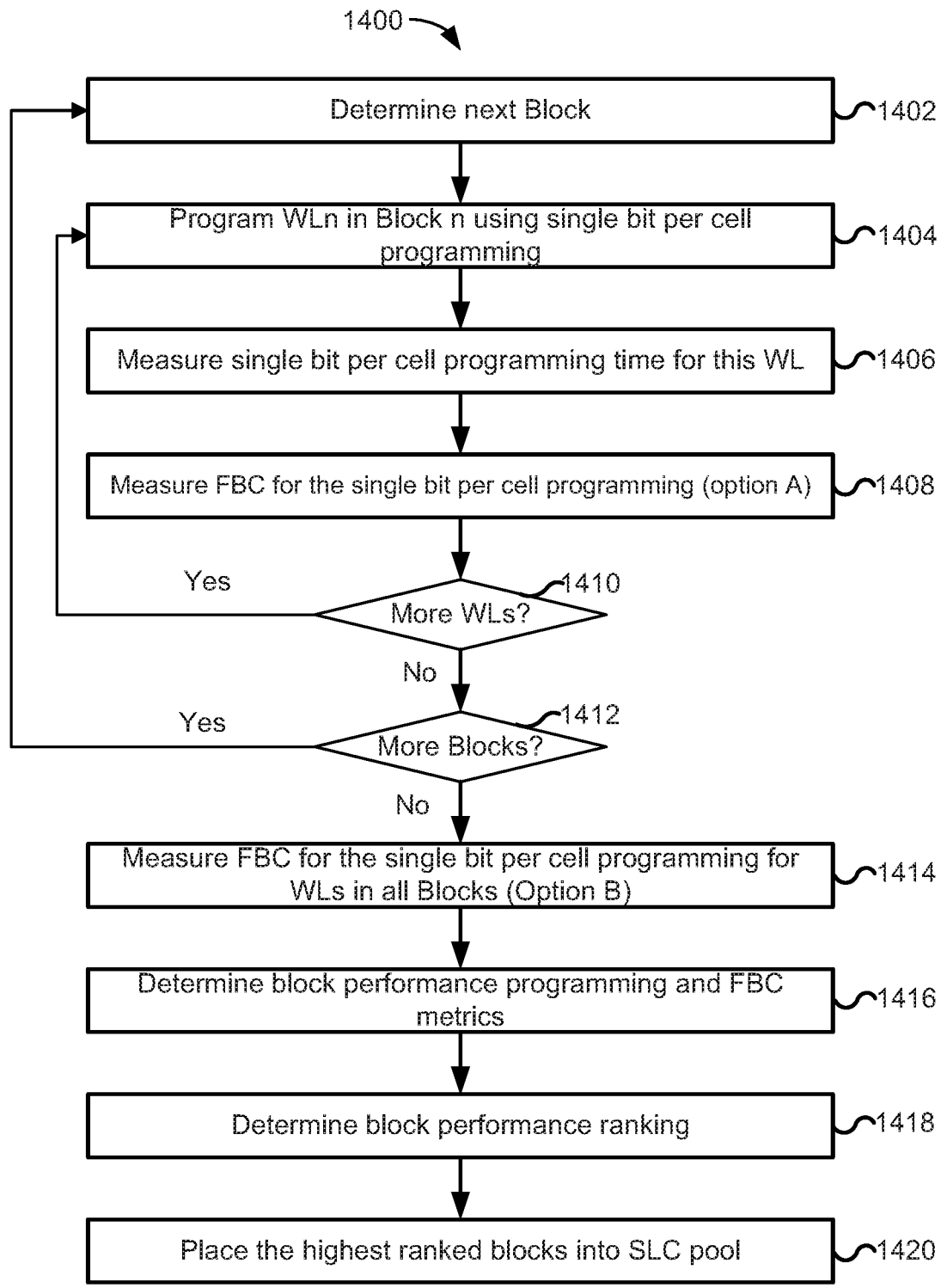
FIG. 14A is a flowchart of one embodiment of a process of placing blocks into an SLC block pool.

FIG. 14A is a flowchart of one embodiment of a process 1400 of placing blocks into an SLC block pool 906. Process 1400 is one embodiment of process 1000. Process 1400 is one embodiment of process 1140. Process 1400 is one embodiment of process 1340. The process 1400 may be performed by a combination of one or more of controller 122, control circuitry 110, state machine 112, decoders 114/124/132, power control 116, read/write circuits 128. In one embodiment, the process 1400 is performed by one or more of performance measurement logic 902, block usage selection 904, and garbage collection logic 910.

Process 1400 is performed on some set of blocks within a memory device 100. This could be any set of blocks. Process 1400 could be performed on all blocks on a memory die, a subset of blocks on a memory die, all blocks on a plane of a memory die, a subset of blocks on a plane, or some other set of blocks on a memory device. Step 1402 includes determining the next block to test.

Step 1404 includes programming a word line of memory cells in the block to a single bit per memory cell. Note that programming a word line of memory cells is one example, and that some other unit of memory cells in the block could be programmed in step 1404. In one embodiment, step 1404 programs one page of data into the memory cells. However, it is not required that exactly one page be programmed in step 1404. In one embodiment, the memory cells are programmed in distributions such as depicted in FIGS. 6A-6C. In one embodiment, the process of FIG. 7A is performed. For example, the instruction sent from the memory controller 122 to the memory die 108 in step 702 may instruct the memory die to program a group of memory cells (such as a word line) to one bit per memory cell. Note that the memory controller 122 may also transmit the address in step 704 and the data in step 706.

The memory die 108 may perform the process of FIG. 7B in response to the instruction. In one embodiment, the memory die 108 performs the process of FIG. 7B once to program the group of memory cells. Assuming that the process of FIG. 7B is successful, the process concludes at step 768 (status=pass). In response to this success, the memory die 108 sends the success status to the memory controller 122. The memory controller 122 receives this result in step 708 of the process of FIG. 7A.

Step 1406 is to measure the single bit per cell programming time for this word line of memory cells. There are numerous ways in which this may be measured. In one embodiment, the memory controller 122 tracks the time between steps 706 and 708 of FIG. 7A. In one embodiment, the memory die 108 tracks the time between steps 760 and 768 of FIG. 7B. The memory die 108 could track the time between other steps, such as between the first time step 762 is performed and step 768.

The programming "time" can be measured by another metric, such as the number of program loops. For example, the memory die 108 may track the number of program loops used in process of FIG. 7B. Note that in the process of FIG. 7B the program voltage (Vpgm) is stepped up in step 786. Hence, the memory die 108 may track the maximum program voltage used in the process of FIG. 7B. Still other metrics are possible to track the programming time.

Step 1408 includes measuring FBC for the single bit per cell programming. Note that the FBC can optionally be performed at this point in the process, as indicated by step 1408 being labeled as "Option A." Option B is to measure the FBC in step 1414. As noted above, a fail bit is defined herein as a bit that when read back from a memory cell, before applying an error correction, is different from its intended program state. A fail bit count (FBC) refers to the total number of failed bits in some unit of data. One way of performing step 1406 is to read back the data from the group of memory cells that were just programmed and compare that data to the data that was to be programmed into the group of memory cells. In one embodiment, the memory die 108 temporarily stores the data it received from the controller 122 and compares the data read back from the memory cells to that temporarily stored data. For example, the memory die 108 might temporally store the data in a set of data latches. In one embodiment, the memory die 108 sends the data it read from the memory cells to the memory controller 122, which compares the data from the memory die 108 to a version of the data the memory controller 122 sent to the memory die 108 to store. In one embodiment, the memory controller 122 runs the data from the memory die 108 through an ECC algorithm to determine how many bits are different from the original data sent from the memory controller 122. Note that this enables the memory controller 122 to perform the FBC at any time.

Step 1410 is a test of whether there are more word lines (WL) to be programmed in this block. If so, then the process 1400 returns to step 1404 to program the next word line. In one embodiment, all word lines in the block are programmed. However, it is not required to program every word line in the block. Thus, note that a running average of program time and/or FBC for the block may be maintained.

After all word lines to be programmed in this block have been programmed (step 1410=no), the control circuit determines whether there are more blocks to process (step 1412). The process repeats steps 1404-1406 (and optionally step 1408) until all blocks have been processed. Then, the process moves on to optional step 1414. Step 1414 is Option B of when to measure the FBC.

Step 1416 is determining single bit per cell programming metrics for each block. Step 1416 includes determining a single metric for programming time for each block and a single metric for FBC for each block, in one embodiment. In one embodiment, the programming time for each word line in a block is averaged to generate a single program time metric for a block. In one embodiment, the FBC for each word line in a block is averaged to generate a single FBC metric for a block. The program time and FBC metrics can be determined for fewer than all word lines in a block. Thus, the block need not be a "closed" block in which all word lines have been programmed.

Figure 15A:
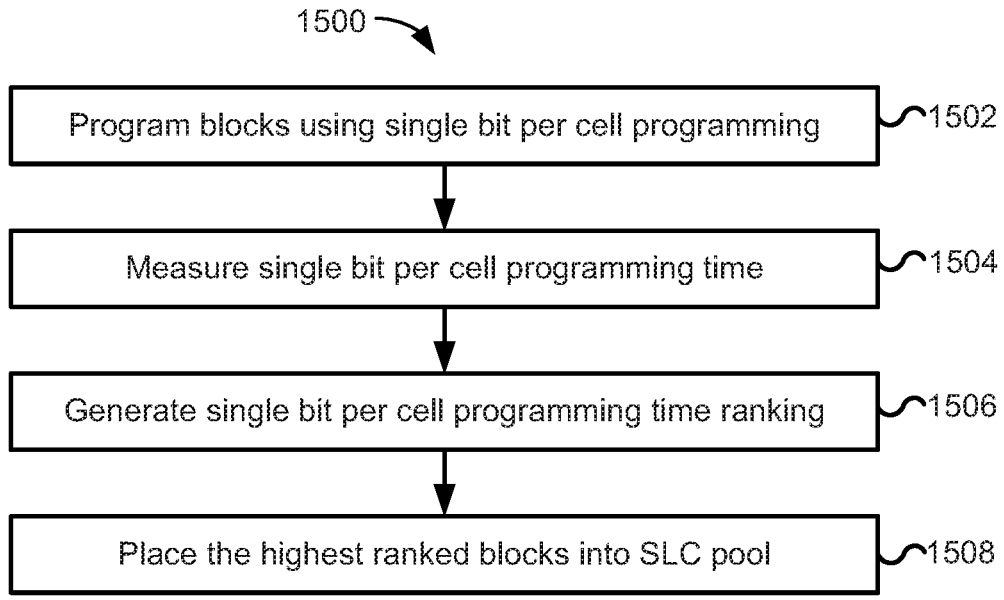
FIG. 15A depicts a flowchart of one embodiment of a process of placing blocks into an SLC block pool based on single bit per cell programming time.
Figure 16A:
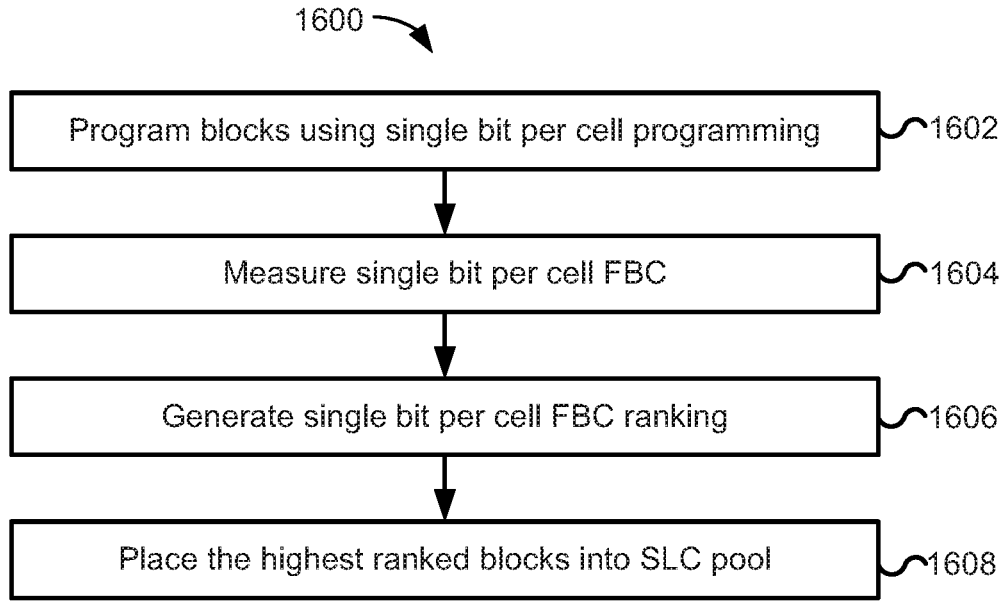
FIG. 16A depicts a flowchart of one embodiment of a process of placing blocks into an SLC block pool based on single bit per cell FBC.

Step 1418 includes generating a single bit per cell block performance ranking. In one embodiment, Equation 1 is used to generate the block ranking. In one embodiment, T is between 0 and 1 (non-inclusive) such that the block ranking is based on both programming time and FBC. FIG. 15A shows an embodiment in which a ranking is based on single bit programming time but not FBC. FIG. 16A shows an embodiment in which a ranking is based on single bit FBC time but not on programming time. In one embodiment, the memory controller 122 performs the ranking. However, the memory die 108 could also include circuitry for performing the ranking.

Step 1420 includes placing the highest ranked blocks into the SLC block pool 906. In one embodiment, the memory controller 122 places "x" blocks with the highest ranking into the SLC block pool 906. For example, 100 blocks for this memory die 108 may be placed into the SLC block pool 906.

Figure 14B:
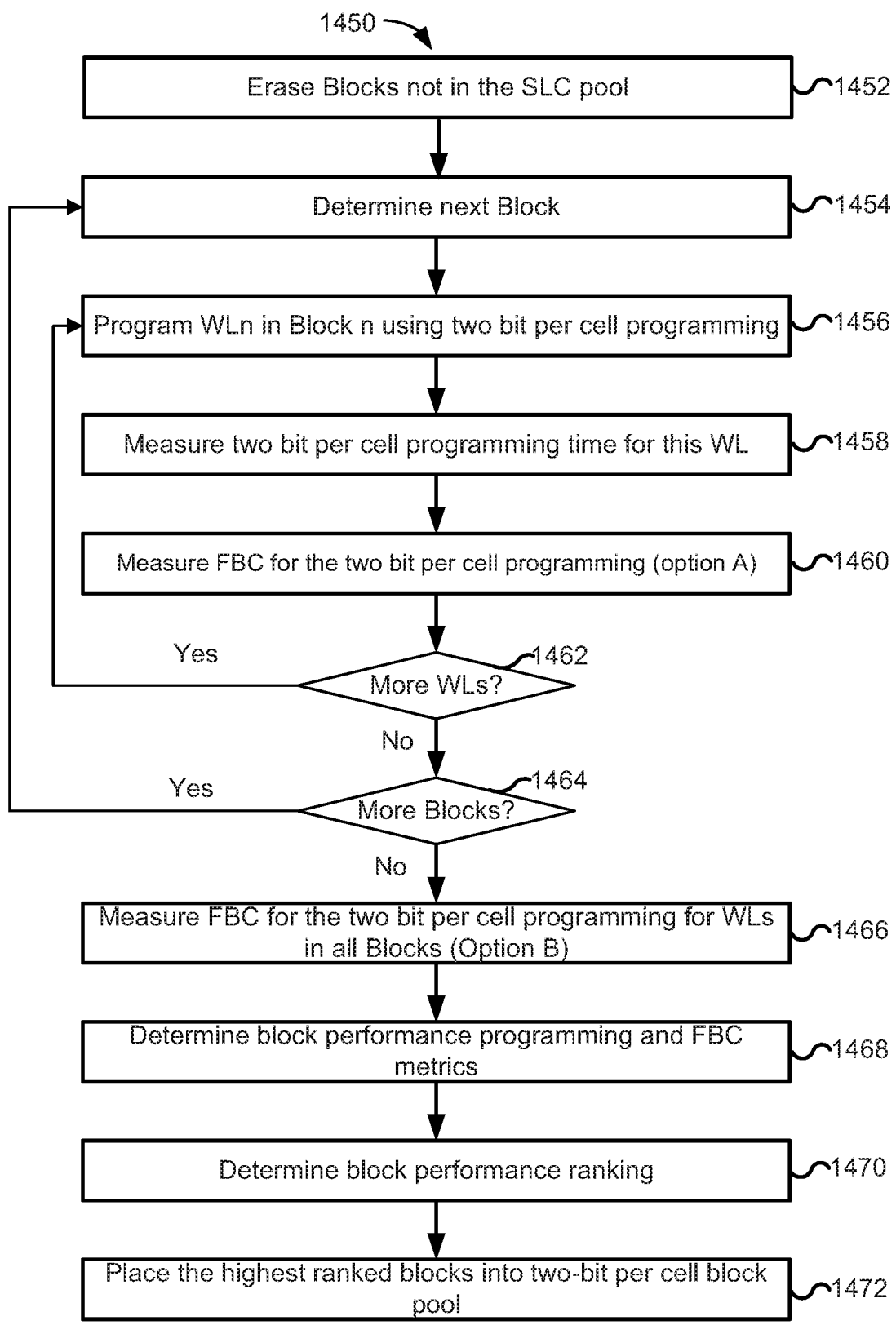
FIG. 14B is a flowchart of one embodiment of a process of placing blocks into an MLC block pool.

FIG. 14B is a flowchart of one embodiment of a process 1450 of placing blocks into an MLC block pool 908. Process 1450 may be performed on a set of blocks that were not placed into an SLC block pool 906. Process 1450 is performed after process 1400, in one embodiment. Process 1450 is one embodiment of process 1000. Process 1450 is one embodiment of process 1140. Process 1450 is one embodiment of process 1340. The process 1450 may be performed by a combination of one or more of controller 122, control circuitry 110, state machine 112, decoders 114/124/132, power control 116, read/write circuits 128. In one embodiment, the process 1450 is performed by one or more of performance measurement logic 902, block usage selection 904, and garbage collection logic 910.

Step 1452 includes erasing blocks that were not placed into an SLC block pool 906. In one embodiment, step 1452 is performed on all of the blocks that were programmed to a single bit per cell in step 1404 of process 1400, but were not placed into the SLC block pool 906 in step 1410.

Step 1454 includes selecting the next block to test.

Step 1456 includes programming the next word line in the selected block from step 1454 using a two-bit per cell programming process. In one embodiment, the memory cells are programmed to distributions such as depicted in FIG. 8A. In one embodiment, the memory cells are programmed using a two pass process such as depicted in FIGS. 8B-8C. In one embodiment, the memory cells are programmed using a two pass process such as depicted in FIGS. 8D-8E. Other types of programming processes can be used.

In one embodiment, the process of FIG. 7A is performed. For example, the instruction sent from the memory controller 122 to the memory die 108 in step 702 may instruct the memory die to program a group of memory cells (such as a word line) to two bits per memory cell. Note that the memory controller 122 may also transmit the address in step 704 and the data in step 706.

The memory die 108 may perform the process of FIG. 7B in response to the instruction. In one embodiment, the memory die 108 performs the process of FIG. 7B twice to program the group of memory cells. For example, the memory die could perform the two pass process of FIGS. 8B and 8C, in which one bit is programmed each program pass. Alternatively, the memory die could perform the two pass process of FIGS. 8D and 8E, in which both bits are programmed coarsely in the first programming pass, and both bits are programmed finely in the second programming pass. It is not required two programming passes be made. For example, the first pass of FIG. 8D might be skipped, with programming going directly from the erase state to the levels depicted in FIG. 8E.

Assuming that the process of FIG. 7B is successful, the process concludes at step 768 (status=pass). Assuming that the process of FIG. 7B is successfully for all programming passes, the process of programming to two-bits per cell is successful. In response to this success, the memory die 108 sends the success status to the memory controller 122. The memory controller 122 receives this result in step 708 of the process of FIG. 7A.

Step 1458 is to measure the two bit per cell programming time for the memory cells on this word line. There are numerous ways in which this may be measured. In one embodiment, the memory controller 122 tracks the time between steps 706 and 708 of FIG. 7A. In one embodiment, the memory die 108 tracks the time from when step 706 is first performed until when step 768 is reached for the final programming pass.

The programming "time" can be measured by another metric, such as the number of program loops. For example, the memory die 108 may track the number of program loops used in process of FIG. 7B. In this case, the number of loops can be added for each program pass, if there is more than one programming pass. Other metrics could be used to measure program time.

Step 1460 includes measured FBC for the two bit per cell programming for this word line of memory cells. Note that the FBC can optionally be performed at this point in the process, as indicated by step 1460 being labeled as "Option A." Option B is to measure the FBC in step 1466. The two bit per cell FBC may be measured by the memory die 108 or controller 122. Techniques discussed in step 1406 of comparing the data just read with a version of the data that was to be programmed may be used in step 1458. Also, the controller 122 performing ECC on the data being read back may also be used. However, in some embodiments of step 1458, there are two codewords. For example, there may be one codeword for each bit to be programmed into the memory cells. In one embodiment, the controller 122 determines a FBC for each codeword.

One way of performing step 1460 is to read back the data from the group of memory cells that were just programmed and compare that data to the data that was to be programmed into the group of memory cells. In one embodiment, the memory die 108 temporarily stores the data it received from the controller 122 and compares the data read back from the memory cells to that temporarily stored data. For example, the memory die 108 might temporally store the data in a set of data latches. In one embodiment, the memory die 108 sends the data it read from the memory cells to the memory controller 122, which compares the data from the memory die 108 to a version of the data the memory controller 122 sent to the memory die 108 to store. In one embodiment, the memory controller 122 runs the data from the memory die 108 through an ECC algorithm to determine how many bits are different from the original data sent from the memory controller 122. Note that this enables the memory controller 122 to perform the FBC at any time.

Step 1462 is a test of whether there are more word lines (WL) to be programmed in this block. If so, then the process 1450 returns to step 1456 to program the next word line. In one embodiment, all word lines in the block are programmed. However, it is not required to program every word line in the block. Thus, note that a running average of program time and/or FBC for the block may be maintained.

After all word lines to be programmed in this block have been programmed (step 1462=no), the control circuit determines whether there are more blocks to process (step 1464). The process repeats steps 1456-1458 (and optionally step 1460) until all blocks have been processed. Then, the process moves on to optional step 1466. Step 1466 is Option B of when to measure the FBC.

Step 1468 is determining two bit per cell programming metrics for each block. Step 1468 includes determining a single metric for programming time for each block and a single metric for FBC for each block, in one embodiment. In one embodiment, the two bit per cell program time for each word line in a block is averaged to generate a single program time metric for a block. In one embodiment, the two bit per cell FBC for each word line in a block is averaged to generate a single FBC metric for a block. The program time and FBC metrics can be determined for fewer than all word lines in a block. Thus, the block need not be a "closed" block in which all word lines have been programmed.

Step 1470 includes generating a two bit per cell block performance ranking. In one embodiment, Equation 1 is used to generate the block ranking. In one embodiment, T is between 0 and 1 (non-inclusive) such that the block ranking is based on both programming time and FBC.

Step 1472 includes placing the highest ranked blocks into a two-bit per cell block pool. In one embodiment, the memory controller 122 places "y" blocks with the highest ranking into the two-bit per cell block pool. For example, 1000 blocks for this memory die 108 may be placed into the two-bit per cell block pool.

After step 1472, the remaining blocks may be placed into a pool for programming at more than two bit per cell. For example, the remaining blocks may be placed into a pool for programming either three or four bits per cell. As another option, a process such as process 1450 could be performed on the remaining blocks, but for three bit per cell programming. The best performing blocks at three bit per cell programming may be placed into a pool for three bit per cell programming, with lowering performing blocks placed into a pool for four bit per cell programming.

A number of variations of processes 1400 and 1450 are possible. A variation of process 1400 is to measure and rank based on single bit per cell programming time, but to not measure and rank based on FBC. FIG. 15A depicts a flowchart of one embodiment of such as process 1500. This process 1500 will not be discussed in detail. Step 1502 includes programming blocks using single bit per cell programming. Step 1502 may be performed for various word lines in some set of blocks as in step 1404 of process 1400.

Step 1504 includes measuring single bit per cell programming time. Step 1504 may measure programming time per word line, as in step 1406 of process 1400. Then, a single programming time metric may be determined for each block, as described in process 1400.

Step 1506 includes generating a single bit per cell programming time block ranking. This step may differ from step 1418, as the ranking is based on single bit per cell programming time, but not FBC.

Step 1508 includes placing the highest ranked blocks into an SLC block pool 906. In one embodiment, the memory controller 122 places "y" blocks with the highest ranking into the two-bit per cell block pool. For example, 1000 blocks for this memory die 108 may be placed into the two-bit per cell block pool.

Figure 15B:
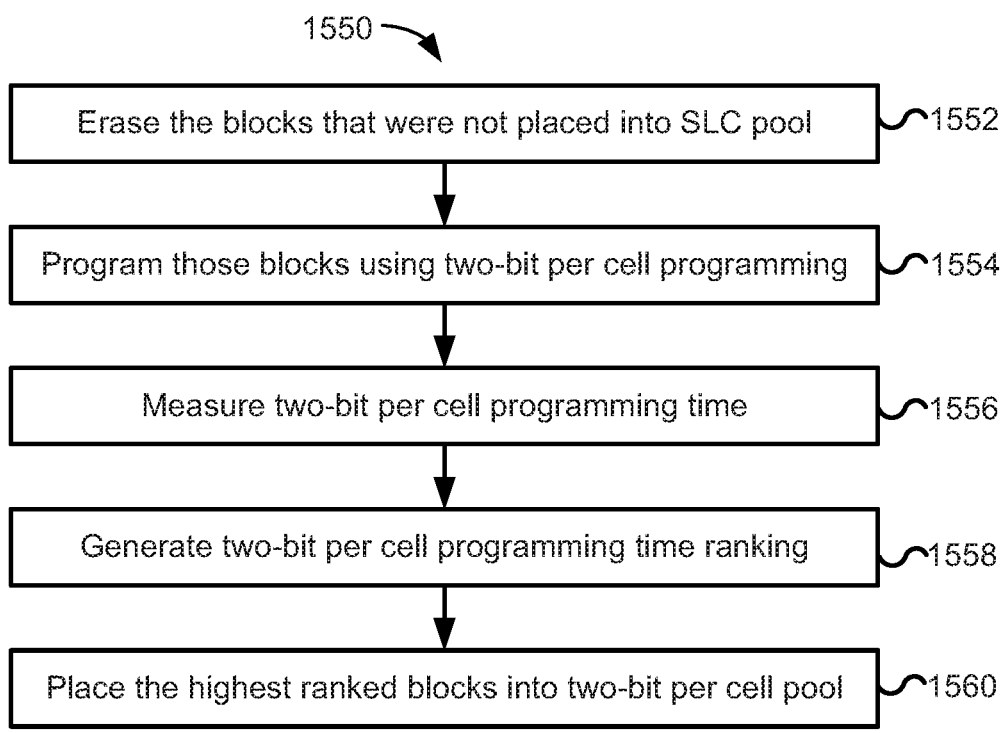
FIG. 15B depicts a flowchart of one embodiment of a process of placing blocks into an MLC block pool based on two bit per cell programming time.

A variation of process 1450 is to measure and rank based on two bit per cell programming time, but to not measure and rank based on FBC. FIG. 15B depicts a flowchart of one embodiment of such as process 1550. Process 1550 is performed in combination with process 1500, in one embodiment. Step 1552 includes erasing the blocks from process 1500 that were not placed into the SLC block pool 906.

Step 1554 includes programming blocks using two bit per cell programming. Step 1554 may be performed for various word lines as in step 1456 of process 1450.

Step 1556 includes measuring two bit per cell programming time. Step 1556 may measure programming time per word line, as in step 1458 of process 1450. Then, a two bit per cell programming time metric may be determined for each block, as described in process 1450.

Step 1558 includes generating a two bit per cell programming time block ranking. This step may differ from step 1470, as the ranking is based on two bit per cell programming time, but not FBC.

Step 1560 includes placing the highest ranked blocks into a two-bit per cell block pool. In one embodiment, the memory controller 122 places "y" blocks with the highest ranking into the two-bit per cell block pool. For example, 1000 blocks for this memory die 108 may be placed into the two-bit per cell block pool. After step 1560, the remaining blocks may be placed into one or more pools for programming at more than two bit per cell. Many variations are possible here, as described in step 1472.

Another variation of process 1400 is to measure and rank based on single bit per cell FBC, but to not measure and rank based on programming time. FIG. 16A depicts a flowchart of one embodiment of such as process 1600. Step 1602 includes programming blocks using single bit per cell programming. Step 1602 may be performed for various word lines in some set of blocks as in step 1404 of process 1400.

Step 1604 includes measuring single bit per cell FBC. Step 1604 may measure single bit per cell FBC per word line, as in step 1460 or 1466 of process 1400. Then, a single FBC metric may be determined for each block, as described in step 1468.

Step 1606 includes generating a single bit per cell FBC block ranking. This step may differ from step 1418, as the ranking is based on single bit per cell FBC, but not programming time.

Step 1608 includes placing the highest ranked blocks into an SLC block pool 906. In one embodiment, the memory controller 122 places "y" blocks with the highest ranking into the two-bit per cell block pool. For example, 1000 blocks for this memory die 108 may be placed into the two-bit per cell block pool.

Figure 16B:
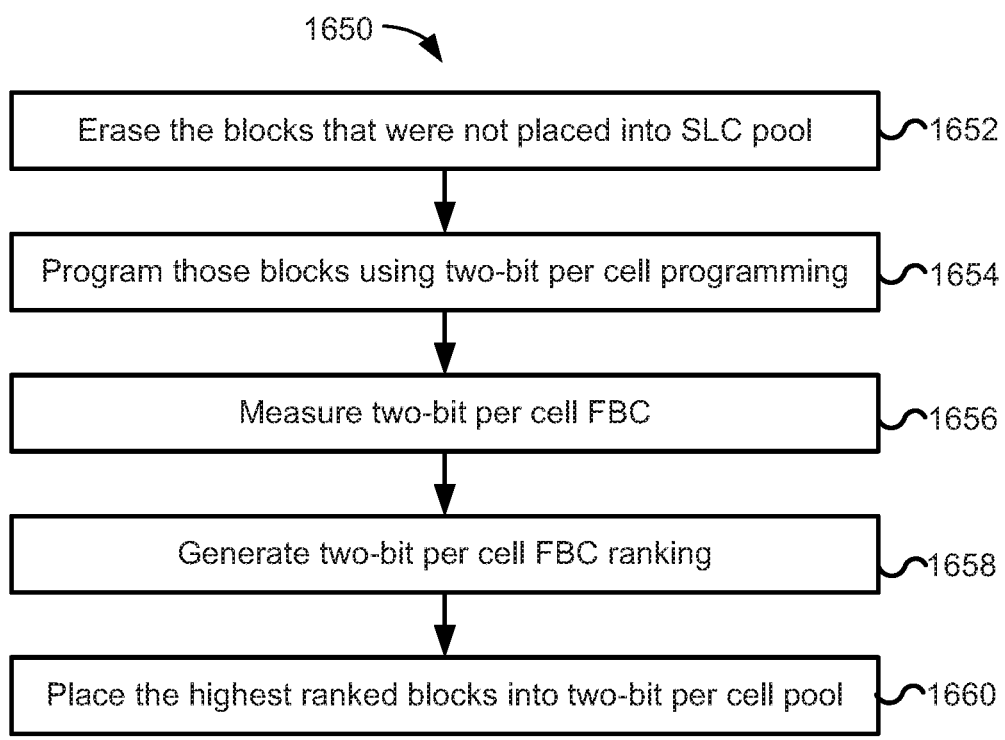
FIG. 16B depicts a flowchart of one embodiment of a process of placing blocks into an MLC block pool based on two bit per cell FBC.

Another variation of process 1450 is to measure and rank based on two bit per cell FBC, but to not measure and rank based on programming time. FIG. 16B depicts a flowchart of one embodiment of such as process 1650. Process 1650 is performed in combination with process 1600, in one embodiment. Step 1652 includes erasing the blocks from process 1600 that were not placed into the SLC block pool 906.

Step 1654 includes programming blocks using two bit per cell programming. Step 1654 may be performed for various word lines as in step 1456 of process 1450.

Step 1656 includes measuring two bit per cell FBC. Step 1656 may measure FBC per word line, as in step 1460 or 1466 of process 1450. Then, a two bit per cell FBC metric may be determined for each block, as described in step 1468 of process 1450.

Step 1658 includes generating a two bit per cell programming time block ranking. This step may differ from step 1470, as the ranking is based on two bit per cell FBC, but not programming time.

Step 1660 includes placing the highest ranked blocks into a two-bit per cell block pool. In one embodiment, the memory controller 122 places "y" blocks with the highest ranking into the two-bit per cell block pool. For example, 1000 blocks for this memory die 108 may be placed into the two-bit per cell block pool. After step 1660, the remaining blocks may be placed into one or more pools for programming at more than two bit per cell. Many variations are possible here.

Figure 17A:
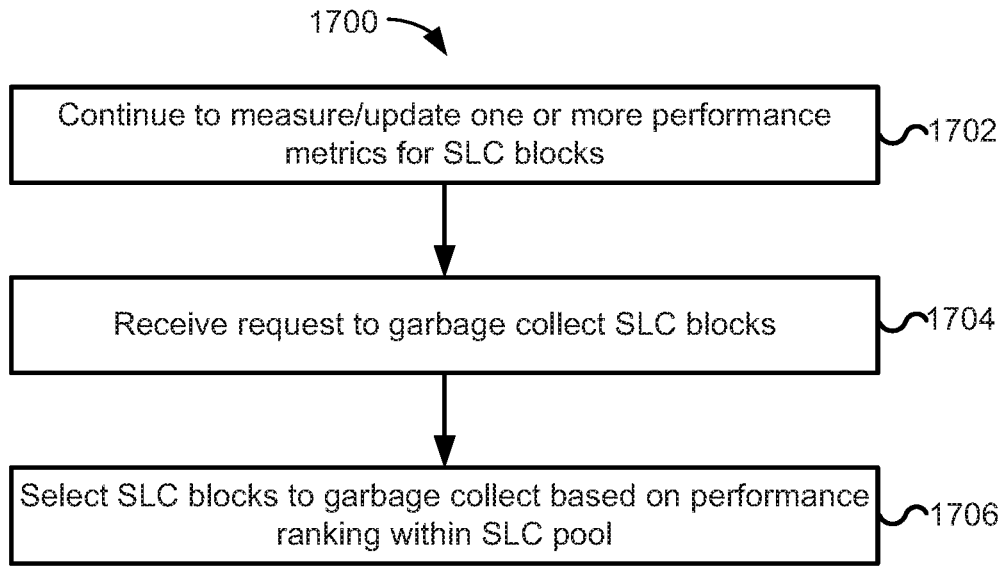
FIGS. 17A and 17B are flowcharts of processes of embodiments of garbage collection.
Figure 17B:
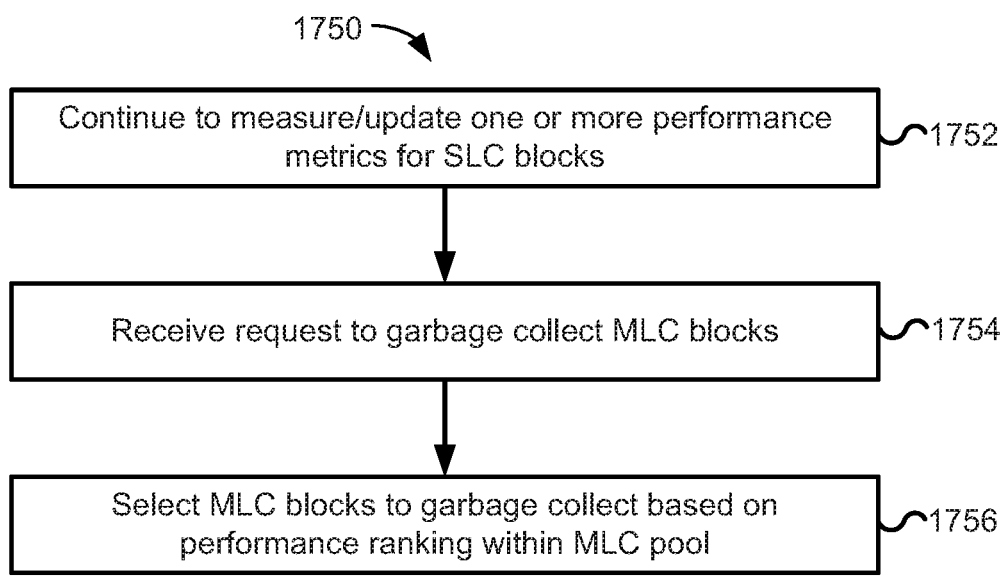

FIGS. 17A and 17B are flowcharts of processes of embodiments of garbage collection. FIG. 17A pertains to garbage collection of SLC blocks, whereas FIG. 17B pertains to garbage collection of MLC blocks.

FIG. 17A is performed after blocks have been assigned to an SLC block pool 906. Any technique may have been used to place the blocks into the SLC block pool 906. In one embodiment, process 1000 is used to place blocks into the SLC block pool 906. In one embodiment, process 1300 is used to place blocks into the SLC block pool 906. In one embodiment, process 1320 is used to place blocks into the SLC block pool 906. In one embodiment, process 1340 is used to place blocks into the SLC block pool 906. In one embodiment, process 1400 is used to place blocks into the SLC block pool 906. In one embodiment, process 1500 is used to place blocks into the SLC block pool 906. In one embodiment, process 1600 is used to place blocks into the SLC block pool 906.

Step 1702 includes continuing to measure and update one or more performance metrics for the SLC blocks. The one or more performance metrics are single bit per cell performance metrics in one embodiment. The one or more performance metrics include, but are not limited to, programming time or FBC. The measuring of one or more performance metrics may be performed in accordance with various processes described herein. In one embodiment, one or more performance metrics are measured in accordance with step 1002. In one embodiment, programming time is measured in accordance with step 1102. In one embodiment, FBC is measured in accordance with step 1122. In one embodiment, programming time is measured in accordance with step 1406. In one embodiment, FBC is measured in accordance with step 1408 or 1414.

Step 1702 may include re-ranking the blocks in the SLC block pool 906 in terms of the one or more performance metrics. The ranking may be performed in accordance with various processes described herein. In one embodiment, ranking is performed in accordance with step 1004. In one embodiment, ranking is performed in accordance with step 1104. In one embodiment, ranking is performed in accordance with step 1124. In one embodiment, ranking is performed in accordance with step 1418.

Step 1704 includes receiving a request to garbage collect SLC blocks. In one embodiment, the controller 122 receives the request from the host. In one embodiment, the memory die 107 receives the request from the controller 122.

Step 1706 includes selecting SLC blocks to garbage collect based on a performance ranking within the SLC block pool 906. In one embodiment, blocks are selected in accordance with programming time as in step 1206. In one embodiment, blocks are selected in accordance with FBC as in step 1226. In one embodiment, blocks are selected in accordance with both programming time and FBC as in step 1248. Note that in step 1706 the ranking is in terms of one bit per cell performance ranking. In one embodiment, the order in which blocks are garbage collected is based on SLC programming time.

FIG. 17B is performed after blocks have been assigned to an MLC block pool 908. Any technique may have been used to place the blocks into the MLC block pool 908. In one embodiment, process 1000 is used to place blocks into the MLC block pool 908. In one embodiment, process 1300 is used to place blocks into the MLC block pool 908. In one embodiment, process 1320 is used to place blocks into the MLC block pool 908. In one embodiment, process 1340 is used to place blocks into the MLC block pool 908. In one embodiment, process 1450 is used to place blocks into the MLC block pool 908. In one embodiment, process 1550 is used to place blocks into the MLC block pool 908. In one embodiment, process 1650 is used to place blocks into the MLC block pool 908.

Step 1752 includes continuing to measure and update one or more performance metrics for the MLC blocks. The one or more performance metrics are two bit per cell performance metrics in one embodiment. The one or more performance metrics include, but are not limited to, programming time or FBC. The measuring of one or more performance metrics may be performed in accordance with various processes described herein. In one embodiment, one or more performance metrics are measured in accordance with step 1002. In one embodiment, programming time is measured in accordance with step 1102. In one embodiment, FBC is measured in accordance with step 1122. In one embodiment, programming time is measured in accordance with step 1458. In one embodiment, FBC is measured in accordance with step 1460 or 1466.

Step 1752 may include re-ranking the blocks in the MLC block pool 908 in terms of the one or more performance metrics. The ranking may be performed in accordance with various processes described herein. In one embodiment, ranking is performed in accordance with step 1004. In one embodiment, ranking is performed in accordance with step 1104. In one embodiment, ranking is performed in accordance with step 1124. In one embodiment, ranking is performed in accordance with step 1470.

Step 1754 includes receiving a request to garbage collect MLC blocks. In one embodiment, the controller 122 receives the request from the host. In one embodiment, the memory die 107 receives the request from the controller 122.

Step 1756 includes selecting MLC blocks to garbage collect based on a performance ranking within the MLC block pool 908. In one embodiment, blocks are selected in accordance with programming time as in step 1206. In one embodiment, blocks are selected in accordance with FBC as in step 1226. In one embodiment, blocks are selected in accordance with both programming time and FBC as in step 1248. Note that in step 1756 the ranking is in terms of two bit per cell performance ranking, in one embodiment.

A first embodiment disclosed herein includes an apparatus, comprising a plurality of blocks of memory cells, performance measurement logic configured to measure one or more performance characteristics of ones of the blocks, and block selection logic configured to select a block for use based on the measured one or more performance characteristics.

In a second embodiment, in accordance with the first embodiment, the block selection logic is further configured to select blocks for a single level cell (SLC) pool and to select blocks for a multi-level cell (MLC) pool based on the one or more measured performance characteristics.

In a third embodiment, in accordance with the first or second embodiments, the block selection logic is further configured to garbage collect blocks based on the one or more measured performance characteristics.

In a fourth embodiment, in accordance with the third embodiment, the block selection logic is further configured to: select blocks within a single bit per cell (SLC) block pool for garbage collection based on a ranking of the SLC blocks based on the one or more measured performance characteristics; and select blocks within a multi-bit per cell (MLC) block pool for garbage collection based on a ranking of the MLC blocks based on the one or more measured performance characteristics.

In a fifth embodiment, in accordance with any of the first to fourth embodiments, the one or more performance characteristics comprise one or more of programming time or fail bit count. The block selection logic is further configured to select a block for use based on one or more of the measured programming time or the measured fail bit count for the respective blocks.

In a sixth embodiment, in accordance with any of the first to fifth embodiments, the one or more performance characteristics comprise programming time. The block selection logic is configured to select a block for use based on the measured programming time for the respective blocks.

In a seventh embodiment, in accordance with any of the first to sixth embodiments, the one or more performance characteristics comprise fail bit count. The block selection logic is further configured to select a block for use based on the measured fail bit count for the respective blocks.

In an eighth embodiment, in accordance with any of the first to seventh embodiments, the measurement logic is further configured to measure single bit per cell performance of the plurality of blocks of memory cells; and the block selection logic is further configured to select a block for single bit per cell use based on the measured single bit per cell performance of the respective blocks.

In a ninth embodiment, in accordance with any of the first to eighth embodiments, the measurement logic is further configured to measure multi-bit per cell performance of blocks not selected for single bit per cell use; and the block selection logic is further configured to select a block for multi-bit per cell use based on the measured multi-bit per cell performance of the respective blocks not selected for single bit per cell use.

In a tenth embodiment, in accordance with any of the first to ninth embodiments, the measurement logic is further configured to determine a metric based on one or more of single bit per cell programming time or fail bit count for memory cells programmed to a single bit per cell; and the block selection logic is further configured to place blocks having the highest metric into a pool of SLC blocks and to place blocks having lower metrics into one or more pools of MLC blocks, wherein a higher metric is associated with better performance.

In an eleventh embodiment, in accordance with the tenth embodiment, the metric is based on single bit per cell programming time.

In an eleventh embodiment, in accordance with the tenth embodiment, the metric is based on single bit per cell programming time and fail bit count for memory cells programmed to a single bit per cell.

One embodiment disclosed herein includes a method comprising: determining, by a control circuit on a non-volatile storage device, one or more performance metrics for ones of a plurality of blocks of memory cells in the non-volatile storage device. The method further comprises ranking, by the control circuit, the plurality of blocks based on the one or more performance metrics. The method further comprises selecting blocks for use, by the control circuit, based on the ranking.

One embodiment disclosed herein includes a non-volatile memory device, comprising: a plurality of blocks of memory cells; performance measurement means for measuring one or more performance characteristics of ones of the blocks of memory cells; ranking means for ranking the plurality of blocks based on the one or more performance characteristics; and block selection means for selecting blocks for single level cell (SLC) use and for selecting blocks for multi-level cell (MLC) use based on the ranking.

Herein, performance measurement means includes one or more of state machine 112, on-chip address decoder 114, power control 116, read/write circuits 128, sense blocks 150, decoders 124/132, controller 122, performance measurement logic 902, an application specific integrated circuit (ASIC), a Field Programmable Gate Array (FPGA), a circuit, a digital logic circuit, an analog circuit, a combination of discrete circuits, gates, or any other type of hardware or combination thereof. The performance measurement means may comprise other hardware and/or software.

Herein, ranking means includes one or more of state machine 112, controller 122, processor 122c, block usage selection logic 904, an application specific integrated circuit (ASIC), a Field Programmable Gate Array (FPGA), a circuit, a digital logic circuit, an analog circuit, a combination of discrete circuits, gates, or any other type of hardware or combination thereof. The ranking means may comprise other hardware and/or software.

Herein, block selection means includes one or more of state machine 112, controller 122, processor 122c, block usage selection logic 904, an application specific integrated circuit (ASIC), a Field Programmable Gate Array (FPGA), a circuit, a digital logic circuit, an analog circuit, a combination of discrete circuits, gates, or any other type of hardware or combination thereof. The block selection means may comprise other hardware and/or software.

For purposes of this document, a block is a physical grouping of memory cells. In one example, a block is a unit of erase. However, in other examples a block need not be a unit of erase. In one example, a block comprises a set of memory cells connected by uninterrupted word lines such as a set of NAND strings connected to a common set of word lines. Other physical arrangement can also be used.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. An apparatus, comprising:
   a plurality of blocks of memory cells;
   performance measurement logic configured to measure one or more performance characteristics of ones of the blocks, the performance measurement logic further configured to measure single bit per cell performance of the plurality of blocks of memory cells; and
   block selection logic configured to select a block for use based on the measured one or more performance characteristics, the block selection logic further configured to select a block for single bit per cell use based on the measured single bit per cell performance of the respective blocks.

2. The apparatus of claim 1, wherein the block selection logic is further configured to select blocks for a single level cell (SLC) pool and to select blocks for a multi-level cell (MLC) pool based on the one or more measured performance characteristics.

3. The apparatus of claim 1, wherein the block selection logic is further configured to garbage collect blocks based on the one or more measured performance characteristics.

4. The apparatus of claim 3, wherein the block selection logic is further configured to:
select blocks within a single bit per cell (SLC) block pool for garbage collection based on a ranking of the SLC blocks based on the one or more measured performance characteristics; and
select blocks within a multi-bit per cell (MLC) block pool for garbage collection based on a ranking of the MLC blocks based on the one or more measured performance characteristics.

5. The apparatus of claim 1, wherein the one or more performance characteristics comprise one or more of programming time or fail bit count, wherein the block selection logic is further configured to select a block for use based on one or more of the measured programming time or the measured fail bit count for the respective blocks.

6. The apparatus of claim 1, wherein the one or more performance characteristics comprise programming time, wherein the block selection logic is configured to select a block for use based on the measured programming time for the respective blocks.

7. The apparatus of claim 1, wherein the one or more performance characteristics comprise fail bit count, wherein the block selection logic is further configured to select a block for use based on the measured fail bit count for the respective blocks.

8. The apparatus of claim 1, wherein:
the performance measurement logic is further configured to measure multi-bit per cell performance of blocks not selected for single bit per cell use; and
the block selection logic is further configured to select a block for multi-bit per cell use based on the measured multi-bit per cell performance of the respective blocks not selected for single bit per cell use.

9. The apparatus of claim 1, wherein:
the performance measurement logic is further configured to determine a metric based on one or more of single bit per cell programming time or fail bit count for memory cells programmed to a single bit per cell; and
the block selection logic is further configured to place blocks having the highest metric into a pool of SLC blocks and to place blocks having lower metrics into one or more pools of MLC blocks, wherein a higher metric is associated with better performance.

10. The apparatus of claim 9, wherein the metric is based on single bit per cell programming time.

11. The apparatus of claim 9, wherein the metric is based on single bit per cell programming time and fail bit count for memory cells programmed to a single bit per cell.

12. A method comprising:
determining, by a control circuit on a non-volatile storage device, one or more performance metrics for ones of a plurality of blocks of memory cells in the non-volatile storage device, the one or more performance metrics comprise a single bit per cell programming time metric;
ranking, by the control circuit, the plurality of blocks based on the one or more performance metrics, the ranking the plurality of blocks comprises ranking the blocks based on the single bit per cell programming time metric; and
selecting blocks for use, by the control circuit, based on the ranking, the selecting blocks for use comprises selecting blocks for single bit per cell use based on the single bit per cell programming time metric of the respective blocks.

13. The method of claim 12, wherein:
the ranking the plurality of blocks comprises ranking the blocks from fastest single bit per memory cell programming time to slowest single bit per memory cell programming time; and
the selecting blocks for use comprises placing the fastest blocks at single bit per memory cell programming time into a single level cell (SLC) block pool and blocks having the slowest single bit per memory cell programming time into one or more multi-level cell (MLC) block pools.

14. The method of claim 13, further comprising:
selecting blocks within the SLC block pool for garbage collection based on the ranking of the SLC blocks; and
selecting blocks within the one or more MLC block pools for garbage collection based on the ranking of the MLC blocks.

15. The method of claim 13, wherein ranking the plurality of blocks; and placing blocks into the single level cell (SLC) block pool and the one or more multi-level cell (MLC) block pools comprises:
ranking blocks not placed into the SLC block pool in terms of two-bit per memory cell programming time; and
placing blocks fastest at two-bit per memory cell programming time in a pool for programming at two bits per memory cell; and
placing remaining blocks into a pool for programming at more than two bits per memory cell.

16. A non-volatile memory device, comprising:
a plurality of blocks of memory cells;
performance measurement means for measuring one or more performance characteristics of ones of the blocks of memory cells, the one or more performance characteristics comprise a single bit per cell fail bit count (FBC);
ranking means for ranking the plurality of blocks based on the one or more performance characteristics, the ranking the plurality of blocks comprises ranking the blocks based on the single bit per cell FBC; and
block selection means for selecting blocks for single level cell (SLC) use and for selecting blocks for multi-level cell (MLC) use based on the ranking, the block selection means further selecting blocks for single bit per cell use based on the single bit per cell FBC of the respective blocks.

17. The non-volatile memory device of claim 16, wherein the block selection means is further for:
placing blocks having the lowest single bit per cell FBC in a single level cell (SLC) block pool; and
placing blocks having a higher single bit per cell FBC in one or more multi-level cell (MLC) block pools.

18. The non-volatile memory device of claim 17, wherein the block selection means is further for:
selecting blocks within the SLC block pool for garbage collection based on the ranking of the SLC blocks; and
selecting blocks within the one or more MLC block pools for garbage collection based on the ranking of the MLC blocks.

* * * * *